United States Patent
Basha et al.

(10) Patent No.: US 10,191,132 B2
(45) Date of Patent: Jan. 29, 2019

(54) METHOD AND APPARATUS FOR MULTI-SLICE IMAGING OF T2-RELAXATION TIME

(71) Applicant: Beth Israel Deaconess Medical Center, Inc., Boston, MA (US)

(72) Inventors: Tamer Basha, Revere, MA (US); Reza Nezafat, Waban, MA (US)

(73) Assignee: BETH ISRAEL DEACONESS MEDICAL CENTER, INC., Boston, MA (US)

( * ) Notice: Subject to any disclaimer, the term of this patent is extended or adjusted under 35 U.S.C. 154(b) by 620 days.

(21) Appl. No.: 14/845,660

(22) Filed: Sep. 4, 2015

(65) Prior Publication Data

US 2016/0139225 A1    May 19, 2016

Related U.S. Application Data

(60) Provisional application No. 62/079,711, filed on Nov. 14, 2014.

(51) Int. Cl.
| | | |
|---|---|---|
| *G01V 3/00* | (2006.01) | |
| *G01R 33/56* | (2006.01) | |
| *G01R 33/36* | (2006.01) | |
| *G01R 33/385* | (2006.01) | |
| *G01R 33/50* | (2006.01) | |
| *G01R 33/483* | (2006.01) | |

(Continued)

(52) U.S. Cl.
CPC ......... *G01R 33/5602* (2013.01); *G01R 33/36* (2013.01); *G01R 33/385* (2013.01);
(Continued)

(58) Field of Classification Search
CPC .............. G01R 33/543; G01R 33/5659; G01R 33/3415; G01R 33/36; A61B 5/055
(Continued)

(56) References Cited

U.S. PATENT DOCUMENTS

| | | | |
|---|---|---|---|
| 8,581,583 B2 | 11/2013 | Greiser | |
| 2008/0004518 A1* | 1/2008 | Stehning | G01R 33/50 |
| | | | 600/410 |

(Continued)

FOREIGN PATENT DOCUMENTS

| | | |
|---|---|---|
| JP | 2006501919 A | 1/2006 |
| KR | 1020050063707 A | 6/2005 |
| KR | 1020130118815 A | 10/2013 |

OTHER PUBLICATIONS

Helene Feliciano et al., "Radial cardiac $T_2$ mapping with alternating $T_2$ preparation intrinsically introduces motion correction", Journal of Cardiovascular Magnetic Resonance, 16(Suppl 1): p. 28, (2014), (2 Pages Total).

(Continued)

Primary Examiner — Walter L Lindsay, Jr.
Assistant Examiner — Frederick Wenderoth
(74) Attorney, Agent, or Firm — Sughrue Mion, PLLC

(57) ABSTRACT

An MRI method includes performing a first image acquisition module of a pulse sequence to acquire a first MR data from slices disposed at different locations in a region of interest (ROI) of an object; performing a second image acquisition module of the pulse sequence, to acquire a second MR data from the slices disposed at the different locations of the ROI, with a T2 preparation time different than that of the first image acquisition module; and generating a T2 map based on the acquired first MR data and the acquired second MR data.

24 Claims, 24 Drawing Sheets

(51) Int. Cl.
*G01R 33/561* (2006.01)
*G01R 33/567* (2006.01)

(52) U.S. Cl.
CPC ......... *G01R 33/4835* (2013.01); *G01R 33/50* (2013.01); *G01R 33/4838* (2013.01); *G01R 33/5613* (2013.01); *G01R 33/5673* (2013.01)

(58) Field of Classification Search
USPC .......................................................... 324/309
See application file for complete search history.

(56) References Cited

U.S. PATENT DOCUMENTS

| | | |
|---|---|---|
| 2011/0181285 A1 | 7/2011 | Greiser |
| 2012/0194188 A1 | 8/2012 | Sun |
| 2012/0283547 A1* | 11/2012 | Wong .................... A61B 5/055 600/410 |
| 2014/0035580 A1 | 2/2014 | Andronesi et al. |

OTHER PUBLICATIONS

Bent O. Kjos et al., "Reproducibility of T1 and T2 Relaxation Times Calculated from Routine MR Imaging Sequences: Phantom Study", AJNR: 6:, Mar./Apr. 1985 (pp. 277-283).

International Search Report, issued by International Searching Authority in corresponding International Application No. PCT/US2015/058005, dated Jan. 19, 2016. (PCT/ISA/210).

Written Opinion, issued by International Searching Authority in corresponding International Application No. PCT/US2015/058005, dated Jan. 19, 2016. (PCT/ISA/237).

Communication dated Mar. 8, 2017, issued by the Korean Intellectual Property Office in counterpart Korean Application No. 10-2015-0140869.

Communication dated Aug. 2, 2017, issued by the Korean Intellectual Property Office in counterpart Korean Patent Application No. 10-2015-0140869.

Communication dated Sep. 8, 2017, issued by the Korean Intellectual Property Office in counterpart Korean Patent Application No. 10-2015-0140869.

Mehmet Akçakaya et al., "Improved Quantitative Myocardial $T_2$ Mapping: Impact of the Fitting Model", Magnetic Resonance in Medicine, vol. 74, No. 1, Aug. 7, 2014, pp. 93-105, XP055401218, (14 pages total).

Sébastien Roujol et al., "Adaptive Registration of Varying Contrast-Weighted Images for Improved Tissue Characterization (ARCTIC): Application to $T_1$ Mapping", Magnetic Resonance in Medicine, vol. 73, No. 4, May 4, 2014, pp. 1469-1482, XP055400873, (14 pages total).

Communication dated Nov. 22, 2017 by the European Patent Office in counterpart European Patent Application No. 15859828.4.

* cited by examiner d1 : Slice Thickness
d2 : Slice Gap
d3 : T2Prep Slice Thickness 1.Fair(2 Maps,2.4%)
2.Fair(9 Maps,10.7%)
3.Good(18 Maps,21.4%)
4.Excellent(55 Maps,65.5%)

METHOD AND APPARATUS FOR MULTI-SLICE IMAGING OF T2-RELAXATION TIME

CROSS-REFERENCE TO RELATED APPLICATION

This application claims the benefit of U.S. Provisional Application No. 62/079,711, filed Nov. 14, 2014, the disclosure of which is incorporated herein in its entirety by reference.

BACKGROUND

1. Field

Apparatuses and methods consistent with exemplary embodiments relate to magnetic resonance imaging (MRI), and, more particularly, to acquiring T2-weighted imaging data using multi-slice imaging.

2. Related Art

When a substance such as human tissue is subjected to a uniform magnetic field, i.e., a static magnetic field $B_0$, the individual magnetic moments of the excited nuclei in the tissue attempt to align with the static magnetic field $B_0$, but precess about it in random order at their characteristic Larmor frequency. If the substance is subjected to a magnetic excitation field $B_1$ that is in the x-y plane and that is near the Larmor frequency, the net magnetization aligned moment $M_z$ may be rotated, i.e., tipped, into the x-y plane to generate a net transverse magnetic moment $M_t$. An MR signal is emitted by the excited nuclei, i.e., spins, after the excitation magnetic field $B_1$ is terminated, and the MR signal may be received and processed to form an image.

In MRI systems, the excited spins induce an oscillating sine wave signal in a receiving coil. The frequency of this signal is near the Larmor frequency, and its initial amplitude is determined by the magnitude of the transverse magnetic moment $M_t$. The amplitude of the emitted MR signal decays exponentially with time.

The T2 time constant is referred to as the spin-spin relaxation constant, or the transverse relaxation constant, and is characterized by a spin-spin relaxation time characterizing the signal decay. The T2 constant is inversely proportional to the exponential rate at which the aligned precession of the spins would dephase after removal of the excitation magnetic field $B_1$ in a perfectly homogeneous magnetic field.

The biological tissues have different T2 values and this property may be exploited to enhance the contrast between the tissues. Accordingly, T2 serves as an informative MRI parameter, providing non-invasive measurements of tissue status and disease prognosis with respect to a wide range of applications and diseases, including imaging of heart, brain, liver, etc.

One technique which uses T2 imaging is a quantative T2 mapping, in which the T2 decay curve is sampled at multiple points, to estimate a T2 value.

In detail, the quantative T2 mapping uses a balanced steady-state free-precession (bSSFP) or gradient echo (GRE) imaging along with T2 magnetization preparation (T2Prep) for pixel-wise T2 mapping. In this technique, multiple single-slice images are acquired with different T2 preparation echo times to obtain multiple images with varying T2 weightings.

However, in the related art T2 imaging, multiple T2-weighted single-slice images are acquired with rest periods of 3-6 seconds inserted in-between the data acquisitions, to allow for full signal recovery before application of a T2Prep with a new T2 value. During the rest period, no magnetization pulses are applied and no image data acquisition is performed. For example, in cardiac imaging, with a three heartbeats rest period used, only three T2-weighted images over 12 heartbeat acquisition are acquired, resulting in data acquisition efficiency of 25%. Therefore, to cover the entire left ventricle (LV), for example, with five slices, the scan time is 60 sec of which 45 sec are a waiting time with no data acquisition, leading to long scan times.

Furthermore, in some cases, when more T2Prep samples are needed for more precise and reproducible T2 maps, the related art scans become longer.

Also, recently, the three-dimensional (3D) T2 mapping sequences have been proposed, which require even longer acquisition time, e.g., 18 min, to cover the entire left ventricular (LV), in cardiac imaging.

Accordingly, apparatuses and methods are needed to provide accurate quantitative T2 mapping in a short amount of time, with reliable reproducible measurements.

SUMMARY

Exemplary embodiments address at least the above problems and/or disadvantages and other disadvantages not described above. Also, the exemplary embodiments are not required to overcome the disadvantages described above, and may not overcome any of the problems described above.

One or more exemplary embodiments provide apparatuses and methods for free-breathing multi-slice T2 mapping by interleaving data acquisition of different unperturbed slices, while a specific slice recovers.

One or more exemplary embodiments provide apparatuses and methods for an interleaved multi-slice acquisition, by sampling the images with different T2 weightings generated using slice-selective T2-preparation pulses.

In accordance with an aspect of an exemplary embodiment, an MRI method includes performing a first image acquisition module of a pulse sequence to acquire a first MR data from slices disposed at different locations in a region of interest (ROI) of an object; performing a second image acquisition module of the pulse sequence, to acquire a second MR data from the slices disposed at the different locations of the ROI, with a T2 preparation time different than that of the first image acquisition module; and generating a T2 map based on the acquired first MR data and the acquired second MR data.

In accordance with an aspect of an exemplary embodiment, an MRI apparatus includes a pulse sequence controller configured to generate a pulse sequence and apply the generated pulse sequence to a gradient coil assembly and an RF coil assembly, the generated pulse sequence including a first image acquisition module to acquire a first MR data from slices disposed at different locations in an ROI of an object; a second image acquisition module of the pulse sequence, to acquire a second MR data from the slices with a different T2 preparation time than that of the first image acquisition module; and an image processor configured to generate a T2 map based on the acquired first MR data and the acquired second MR data.

In accordance with an aspect of an exemplary embodiment, there is provided a non-transitory computer-readable storage medium having recorded thereon a computer program which, when executed by a computer, causes the computer to execute a method including performing a first image acquisition module of a pulse sequence to acquire a first MR data from slices disposed at different locations in an ROI of an object; performing a second image acquisition module of the pulse sequence, to acquire a second MR data from the slices disposed at the different locations of the ROI, with a T2 preparation time different than that of the first image acquisition module; and generating a T2 map based on the acquired first MR data and the acquired second MR data.

BRIEF DESCRIPTION OF THE DRAWINGS

The application file contains at least one drawing executed in color. Copies of this patent application publication with color drawing(s) will be provided by the Office upon request and payment of the necessary fee.

The above and/or other aspects will become more apparent by describing certain exemplary embodiments with reference to the accompanying drawings, in which.

DETAILED DESCRIPTION

Figure 1:
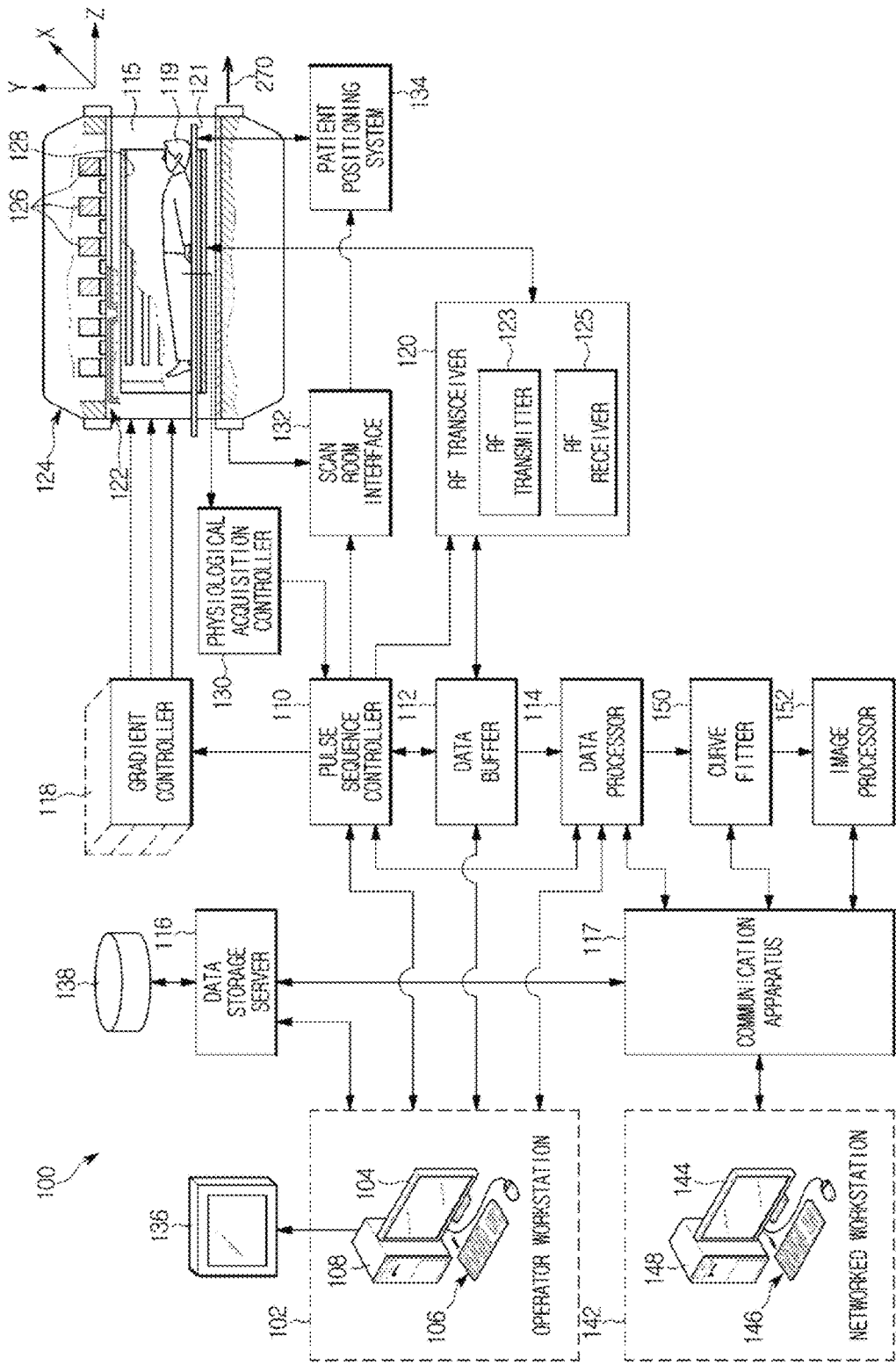
FIG. 1 is a block diagram of an MRI apparatus, according to an exemplary embodiment.

Certain exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions are not described in detail since they would obscure the description with unnecessary detail.

Referring to FIG. 1, an example of an MRI apparatus 100 is illustrated. The MRI apparatus 100 includes a magnet assembly 124, an operator workstation 102, including a display 104, one or more input devices 106, such as a keyboard, mouse, microphone, joystick, etc., and a processor 108. The operator workstation 102 provides the operator interface that enables scan orders to be entered into the MRI apparatus 100. For example, the operator workstation 102 may be coupled to at least one of a pulse sequence controller 110, a data buffer 112, a data processor 114, a data storage server 116, a curve fitter 150, and an image processor 152, which may be interconnected with one another via a communication apparatus 117, which may include any suitable network interface, to provide a connection wirelessly and/or by wire. As an example, the communication apparatus 117 may include a proprietary network, a dedicated network, and/or an open network, such as the Internet.

The magnet assembly 124 includes a main magnet 126, a gradient coil assembly 122, and an RF coil assembly 128 which are sequentially arranged in that order from outermost side to the bore 115. The object 119 is located on the cradle 121 which is moved to the bore 115 of the magnet system 124, such that a magnetic field may be applied to the object 119. The main magnet 126 may be an open magnet.

The main magnet 126 generates a static magnetic field $B_0$ in the bore 115 of the magnet system 124. A direction of the static magnetic field $B_0$ may be parallel or perpendicular to a body axis 270 of the object 119, i.e., to a longitudinal direction of the object 119.

The pulse sequence controller 110 functions in response to instructions received from the operator workstation 102 to operate a gradient controller 118 and an RF transceiver 120.

Gradient waveforms to perform the prescribed scan are generated and applied to the gradient controller 118. The gradient controller 118 is connected with gradient coils of a gradient coil assembly 122, and outputs signal pulses to form the magnetic field gradients. The gradient controller 118 may include driving circuits corresponding to X, Y, and Z gradient coils of the gradient coil assembly 122 that respectively generate the magnetic field gradients in X-axis, Y-axis, and Z-axis directions that are orthogonal to each other and are used for position encoding and slice selection.

The RF transceiver 120 is connected with the RF coil assembly 128 to apply an RF pulse and/or a signal related to application of the RF pulse to the RF coil assembly 128. As illustrated in FIG. 1, the RF coil assembly 128 may include a whole-body coil which may serve as a transmit/receive coil. Additionally or optionally, the RF coil assembly 128 may include a local RF coil or coils which may be configured to transmit the RF pulse to and/or receive the MR signals from the object. For example, the RF transceiver 120 may include an RF transmitter 123 which transmits the RF pulse sequence to the whole-body coil or the local coil of the RF coil assembly 128, to apply RF pulses to the object, to perform the prescribed magnetic resonance pulse sequence. The MR signals from the object may be detected by the whole-body coil or the local coil of the RF coil assembly 128 and may be received by an RF receiver 125 of the RF transceiver 120, where they are amplified, demodulated, filtered, and digitized based on commands received from the pulse sequence controller 110. The RF transmitter 123 may generate a wide variety of RF pulses used in MRI pulse sequences. In response to the scan prescription and control of the pulse sequence controller 110, the RF transmitter 123 may generate RF pulses of desired frequency, phase, and pulse amplitude.

The RF receiver 125 may include one or more RF receiver channels. Each RF receiver channel may include an associated RF preamplifier that amplifies the MR signal received by the RF coil assembly 128, and a detector that detects and digitizes the in phase and quadrature components of the received MR signal. The magnitude of the received MR signal may, therefore, be determined at any sampled point by the square root of the sum of the squares of the in phase and quadrature components, i.e., I and Q channels:

$$M=\sqrt{I^2+Q^2} \quad \text{Equation (1)}$$

The phase of the received MR signal may be determined as:

$$\varphi = \tan^{-1}\left(\frac{Q}{I}\right) \quad \text{Equation (2)}$$

The pulse sequence controller 110 may optionally receive patient data from a physiological acquisition controller 130. For example, the physiological acquisition controller 130 may receive physiological information signals from different sensors connected to the object 119, such as electrocardiograph (ECG) signals and/or respiratory signals indicating a respiratory expansion from respiratory bellows or other respiratory monitoring device. The physiological information signals may be used by the pulse sequence controller 110 to synchronize, or gate, the execution of the scan with the object's heart beat and/or respiration.

The pulse sequence controller 110 may be connected to a scan room interface 132 that receives signals from various sensors associated with the condition of the object 119 and the magnet system. For example, the scan room interface 132 provides commands to a patient positioning system 134 to move the object 119 on the cradle 121 to desired positions during the scan.

The digitized MR signal samples generated by the RF transceiver 120 are received by the data buffer 112. The data buffer 112 operates in response to instructions received from the operator workstation 102 to receive the real-time magnetic resonance data and provide buffer storage, such that no data is lost by data overrun.

In the scans that require information derived from acquired magnetic resonance data to control the further performance of the scan, the data buffer 112 may be controlled to generate such information and convey it to the pulse sequence controller 110. For example, during prescans, magnetic resonance data may be acquired and used to calibrate the pulse sequence performed by the pulse sequence controller 110. As another example, navigator signals may be acquired and used to adjust the operating parameters of the RF transceiver 120 and/or the gradient controller 118, or to control the view order in which k-space is sampled. As another example, the data buffer 112 may process MR signals used to detect the arrival of a contrast agent, for example, in an MR angiography (MRA) scan. For example, the data buffer 112 acquires magnetic resonance data and processes it in real-time to generate information that is used to control the scan.

The data processor 114 receives magnetic resonance data from the data buffer 112 and processes it in accordance with instructions downloaded from the operator workstation 102. The data processor 114 may obtain image data sets having different MR parameter values to generate an MR parameter map. The MR parameter map may include at least one of a T1 map, a T2 map, etc. An image processor 152 may form the MR parameter map based on the obtained data set. For example, the image processor 152 may perform at least one of reconstructing two-dimensional (2D) or three-dimensional (3D) images by performing a Fourier transformation of raw k-space data, performing image reconstruction algorithms, such as iterative or backprojection reconstruction algorithms, applying filtering to the raw k-space data or to the reconstructed image data, generating functional magnetic resonance (fMR) images, calculating motion or flow images, and so on.

Although the curve fitter 150 and the image processor 152 are illustrated as components separate from the data processor 114 in FIG. 1, the curve fitter 150 and/or the image processor 152 may be incorporated within the data processor 114. Also, at least one of the curve fitter 150 and the image processor 152 may be omitted and the data processor 114 may perform functions at least one of the curve fitter 150 and the image processor 152, in accordance with exemplary embodiments.

Images reconstructed by the image processor 152 may be transferred to the operator workstation 102 and/or stored. Real-time images may be stored in a database memory cache (not shown), from which the images may be output to operator display 112 or a display 136 that is located near the magnet assembly 124. Batch mode images or selected real time images may be stored in a host database on disc storage 138 or on a remote server (not shown). When the images have been reconstructed and transferred to storage, the image processor 152 may notify the operator workstation 102, i.e., a user. The operator workstation 102 may be used by an operator to archive the images, generate films, or send the images via a network to other facilities.

The MRI apparatus 100 may include one or more networked workstations 142. For example, a networked workstation 142 may include a display 144, one or more input devices 146, such as a keyboard and mouse, and a processor 148. The networked workstation 142 may be located within the same facility as the operator workstation 102, or in a different facility, for example, a different healthcare institution or a clinic.

The networked workstation 142 may gain remote access to the data processor 114, curve fitter 150, image processor 152, and/or data storage server 116 via the communication apparatus 117. In this manner, magnetic resonance data, reconstructed images, or other data may be exchanged with the networked workstations 142, such that the data or images may be remotely processed by a networked workstation 142. The data may be exchanged in any suitable format, such as in accordance with the transmission control protocol (TCP), the Internet protocol (IP), or other suitable protocols.

Figure 7:
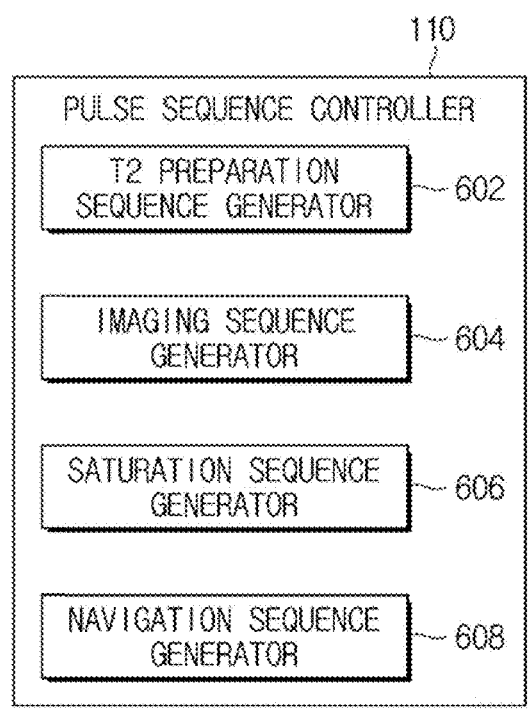
FIG. 7 illustrates a portion of an MRI apparatus, according to an exemplary embodiment.

Referring to FIG. 7, the pulse sequence controller 110 may include a T2-preparation sequence generator 602 and an imaging sequence generator 604 to control an execution of a pulse sequence.

Figure 2:
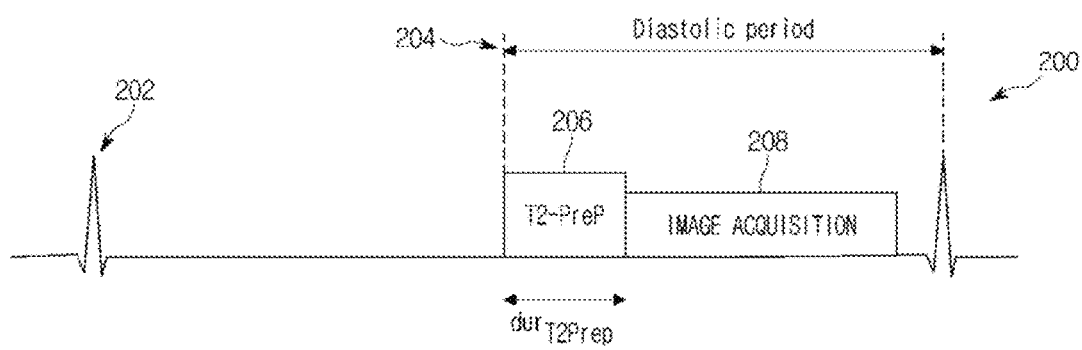
FIG. 2 is a diagram of a pulse sequence for acquiring T2-weighted data, according to an exemplary embodiment.

Referring to FIG. 2, a T2 weighted imaging process 200 is illustrated. The process 200 may be a gated acquisition, for example, using an ECG signal as a trigger 202 used to determine a period in the cardiac cycle, such as a diastolic period 204. The T2-preparation sequence generator 602 may execute a T2-preparation module 206 based on the trigger 202 after a time delay lapses, and, consequently, the imaging sequence generator 604 may execute an imaging sequence and image data may be acquired, in an image acquisition 208.

Figure 3A:
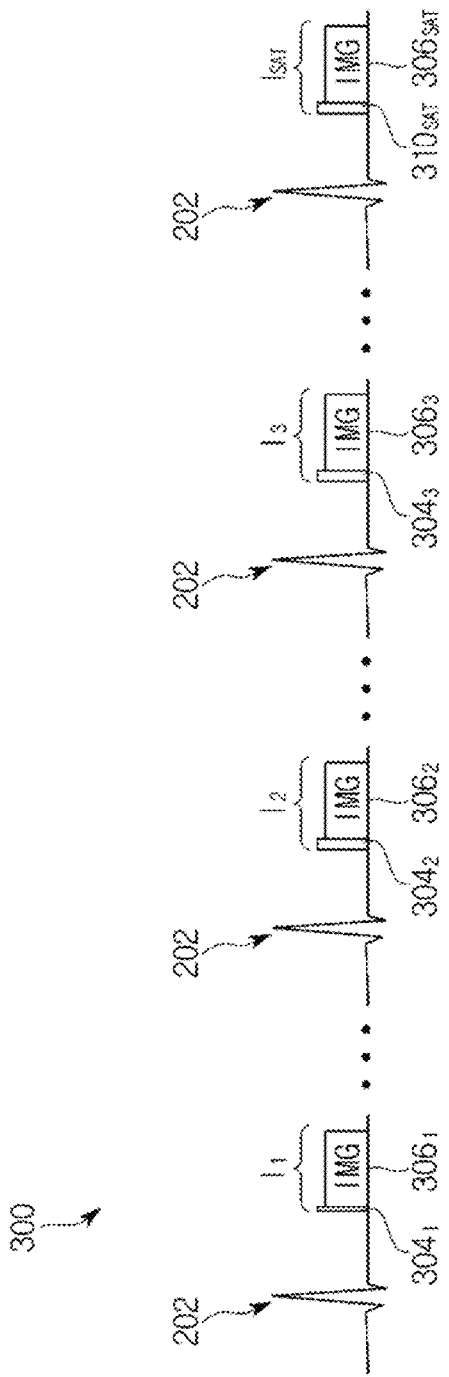
FIG. 3A is a diagram of a pulse sequence according to an exemplary embodiment.

Referring to FIG. 3A, the T2 weighted pulse sequence of FIG. 2 may be adapted in accordance with an exemplary embodiment to generate a pulse sequence 300, by the pulse sequence controller 110.

The pulse sequence 300 conceptually illustrates first, second, and third image acquisition modules $I_1$, $I_2$, and $I_3$ and a saturation image acquisition $I_{SAT}$ which may be performed to acquire T2 weighted images. Although only three image acquisition modules $I_1$ to $I_3$ are illustrated and described, this is a non-limiting example, and a number N of the image acquisition modules may be greater than three, for example, 4, 5, . . . 10, . . . 15, etc., to acquire a corresponding number of images.

Each of the first to third image acquisition modules $I_1$, $I_2$, and $I_3$ includes a different T2-preparation module $304_1$, $304_2$, and $304_3$, i.e., T2-preparation pulse sequences with differently set parameters, for example, with differently set time echo lengths $TE_{T2P}$, executed by the T2-preparation sequence generator 602. For example, the first to third image acquisition modules $I_1$, $I_2$, and $I_3$ are performed with three different T2Prep echo times of 0 ms, 25 ms, and 50 ms, and, then, the saturation image acquisition $I_{SAT}$ is performed with a very long time simulating infinity. The first image acquisition module $I_1$ may correspond to sampling at $TE_{T2P}=0$ ms.

Each of the first to third image acquisition modules $I_1$, $I_2$, and $I_3$ further includes corresponding imaging modules $306_1$, $306_2$, and $306_3$ which include pulse sequences to acquire the MR image data of the object. For example, the imaging modules $306_1$ to $306_3$ may include imaging sequences executed by the imaging sequence generator 604.

As described in detail below, in an exemplary embodiment, the T2-preparation modules $304_1$, $304_2$, and $304_3$ may include slice-selective gradients, to allow acquisition of multiple slices within each of the first to third image acquisition modules $I_1$ to $I_3$, and are sequentially executed with different $TE_{T2P}$ times for each of the first to third image acquisition modules $I_1$, $I_2$, and $I_3$, while using slice-selective pulses to select different slices for data acquisition in each of the first to third image acquisition modules $I_1$, $I_2$, and $I_3$.

In an exemplary embodiment, after each image acquisition, there is no need to wait for magnetization recovery before performing next image data acquisition of the slice or the next T2-weighting, as in the related art. Instead, an exemplary pulse sequence 300 allows imaging of the rest of the slices while the spins in the specific slice recover from the last acquisition. Thus, an exemplary embodiment allows a fast interleaved multi-slice acquisition with no need for long waiting time, e.g., without 3 to 6 seconds rest periods of the related art, for magnetization recovery after the acquisition of each single-shot image. Thus, a scan time may be reduced up to at least 25% making the T2 mapping more feasible to apply in clinical scans.

At the end of the sequence 300, a saturation sequence generator 606 may execute a saturation (SAT) pulse $310_{SAT}$, which aims to destroy all magnetization along the z-axis, with a time delay after a corresponding trigger signal 202 to perform a saturation image acquisition $I_{SAT}$. For example, the imaging sequence generator 604 may control an execution of the imaging module $306_{SAT}$ to acquire a saturation image data after an execution of a preceding SAT pulse $310_{SAT}$. For example, the SAT pulse $310_{SAT}$ may include a composite saturation pulse including four rectangular 90° RF pulse trains with crusher gradients in between the RF pulses. The RF pulses bandwidth may be about 1 kHz, and the composite total duration may be 10 ms. However, this is not limiting.

Figure 3B:
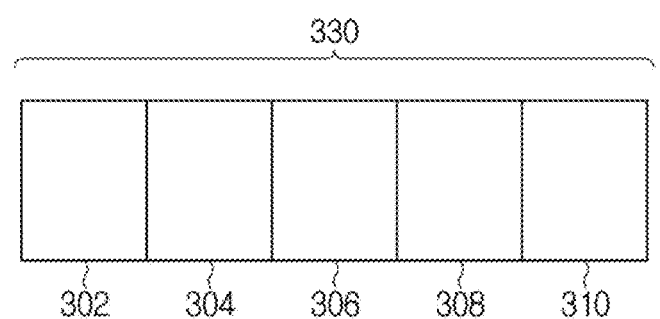
FIG. 3B is a schematic diagram of an ROI of an object.

Referring to FIG. 3B, in an exemplary embodiment, the data processor 114 may control the data acquisition in each of the first to third image acquisition modules $I_1$ through $I_3$ and saturation image acquisition $I_{SAT}$ for M number of slices 330, for example, a total of five single-shot image acquisitions for five different slices 302, 304, 306, 308, and 310, e.g., a first slice, a second slice, a third slice, a fourth slice, and a fifth slice, respectively. However, the M number of slices is not limited to five and may be two, three, four, six, . . . , ten, etc.

The slices 330, for example, a first slice 302, a second slice 304, a third slice 306, a fourth slice 308, and a fifth slice 310, may be located at different spatial locations across an ROI 332 of an object or a portion of the ROI of the object, and the data acquisition of each slice 302, 304, 306, 308, and 310 may be performed using slice-selective excitation of a tissue of one slice and a single-shot acquisition at corresponding different locations of the slices.

In an exemplary embodiment, one data acquisition of each of the slices 330 proceeds in turn, after a single slice-selective magnetization preparation, during the magnetization recovery of the adjacent slice or a slice that has been previously imaged. Although the slices 302, 304, 306, 308, and 310 are illustrated as slices disposed at five consecutive locations in the ROI 332, the slices may be located discontinuously, e.g., with a physical gap between each pair of adjacent slices. Also, the slices do not need to be acquired in an anatomically-arranged order of slices and may be acquired in a random order as specified by a user. Also, an exemplary embodiment may be applied to slabs, segments, etc.

In an exemplary embodiment, for each T2Prep echo time, e.g., 0 ms, 25 ms, and 50 ms, each slice is acquired once using an ECG-triggered single shot acquisition, in different image acquisition modules. This process is repeated for different $TE_{T2P}$ echo times, where each image is acquired after a slice-selective T2Prep pulse. Finally, a last repetition of the image acquisition is performed by replacing each slice-selective T2Prep pulse with a saturation pulse to simulate the effect of a very long $TE_{T2P}$ (i.e., $TE_{T2P}=\infty$). For $TE_{T2P}=0$ ms, 90° pulse directly followed by −90° may be used with no waiting time and no refocusing pulses in between.

Figure 3C:
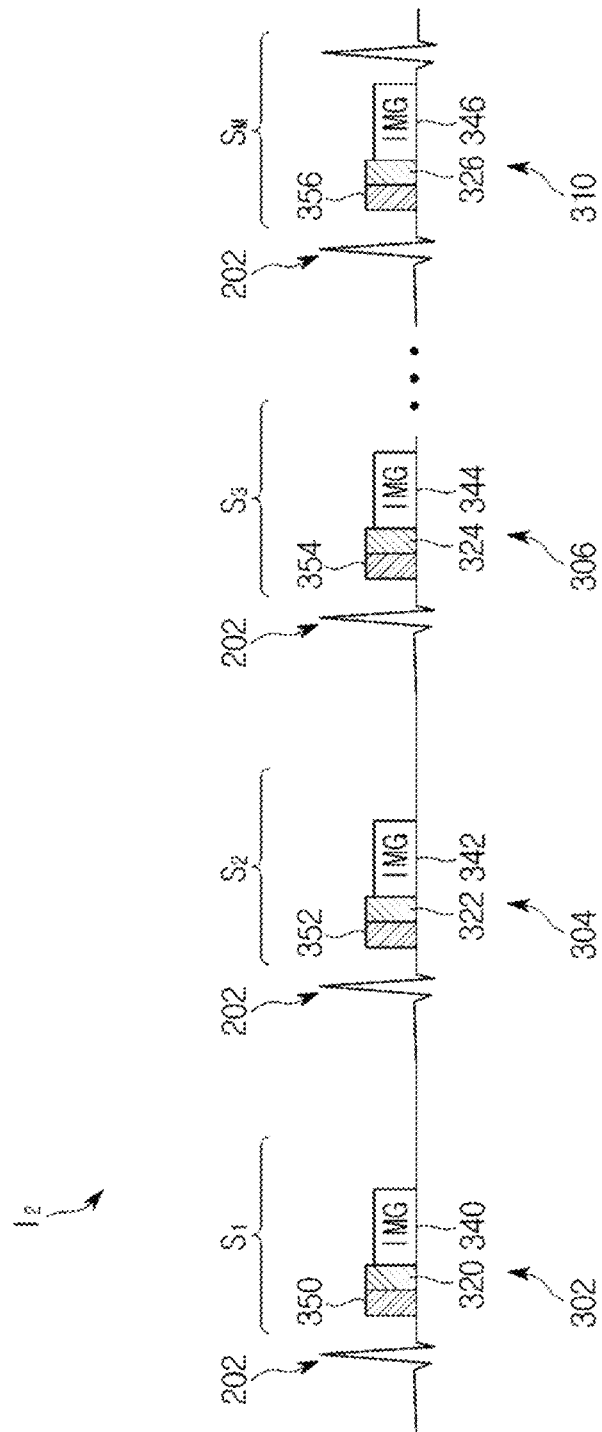
FIG. 3C is a diagram of a pulse sequence according to an exemplary embodiment.

Referring to FIG. 3C, the image data acquisition of different slices is illustrated with reference to the second image acquisition module $I_2$.

During the second image acquisition module $I_2$, an image acquisition with magnetization preparation is performed to acquire the image data from each of the slices 330, e.g., the first slice 302, the second slice 304, the third slice 306, the fourth slice 308, and the fifth slice 310. In the described example, the number M of slices is equal to five; however, this is not limiting.

The data acquisition for each of the slices 330 may be triggered based on an ECG signal 202, for example, with a time delay. In detail, each of the magnetization preparation modules 320, 322, and 324 to 326 follows each of the navigator pulses 350, 352, and 354 to 356 which are executed at the beginning of each of first, second, and third to Mth data acquisition blocks $S_1$, $S_2$, and $S_3$ through $S_M$. Each of the slice imaging modules 340, 342, and 344 to 346 are executed following the magnetization preparation modules 320 through 326.

The above-described data acquisition blocks $S_1$ through $S_M$ are similarly performed in the first and the third image acquisition modules $I_1$ and $I_3$ with different $TE_{T2P}$. However, since the first image acquisition module $I_1$ may correspond to sampling at $TE_{T2P}=0$ ms, no magnetization preparation pulses are performed in the magnetization preparation modules 320 to 326 in an execution of the first image acquisition module $I_1$.

For example, to further facilitate coverage of all five slices and sufficient recovery time, the image acquisition may be performed during free breathing. To compensate for through-plane motion that might occur due to breathing, a prospective slice tracking may be performed, for example, using a pencil-beam respiratory navigator positioned on the right-hemi-diaphragm and acquired immediately before each T2Prep pulse. Pencil beam navigator techniques are known to those skilled in the art, and, thus, excessive details are omitted.

Figure 4A:
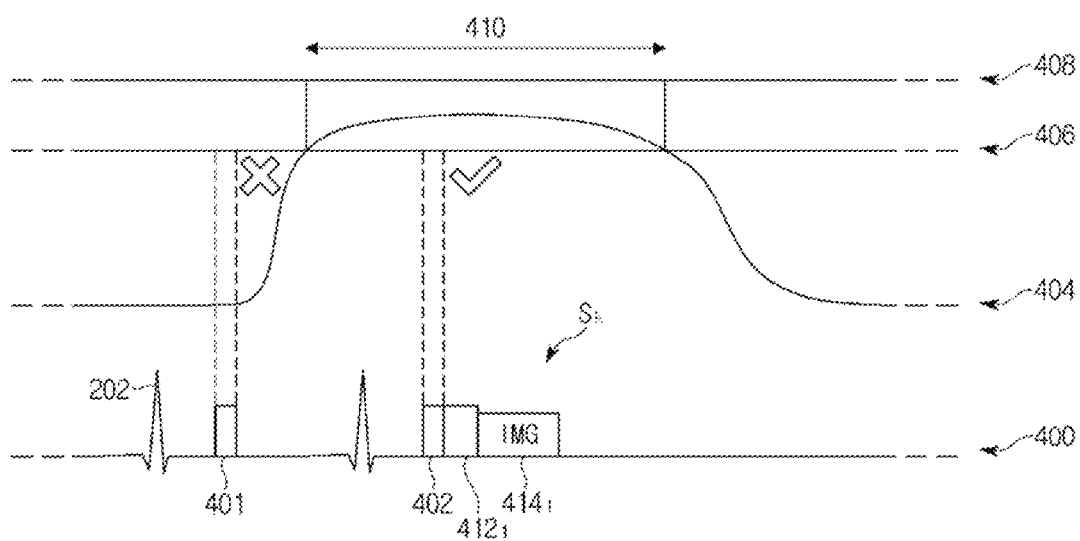
FIG. 4A is a diagram of a pulse sequence according to an exemplary embodiment.

Referring to FIG. 4A, a pulse sequence section 400 is illustrated. For example, the pulse sequence section 400 may be a section of the pulse sequence 300 described above with reference to FIG. 3A which may include a plurality of such pulse sequence sections. The pulse sequence section 400 may correspond to a data acquisition block $S_k$ which represents one of the data acquisition blocks of the first through third image acquisition modules $I_1$ through $I_3$.

The pulse sequence section 400 may include a navigator module including a navigator pulse 402 preceding a T2-preparation module $412_1$, according to an exemplary embodiment. For example, the data acquired by using the navigator module may be used to gate each of subsequent data acquisition blocks $S_1$ through $S_M$. For example, the data acquired using the navigator module may be used to track breathing. In the illustrated example of tracking breathing, a position of the diaphragm of the object being imaged may be tracked over time, as illustrated by a positional graph 404. The positional information on the positional graph 404 may be compared to a set of positional thresholds 406, 408 that indicate a range 410 of accepted diaphragm positions.

As illustrated in FIG. 4A, the navigator pulse 402 is applied before the T2-preparation module $412_1$ and before an associated imaging module $414_1$, which are timed to be within the range 410 of the accepted diaphragm positions. That is, if the position of the tracked physiological movement as determined by the image data acquired using the navigator pulse 402 is within the accepted range 410, then the T2-preparation module $412_1$ is applied and the imaging module $414_1$ is performed thereafter.

If the position of the navigator pulse 401 is outside of the range 410 of the accepted diaphragm positions, no T2-preparation pulses or imaging pulses are applied. The image data is acquired in the next RR interval by executing the navigator pulse and the data acquisition block. The navigator pulses may be executed by a navigation sequence generator 608 and the navigator image data may be acquired and processed by the data processor 114.

Figure 4B:
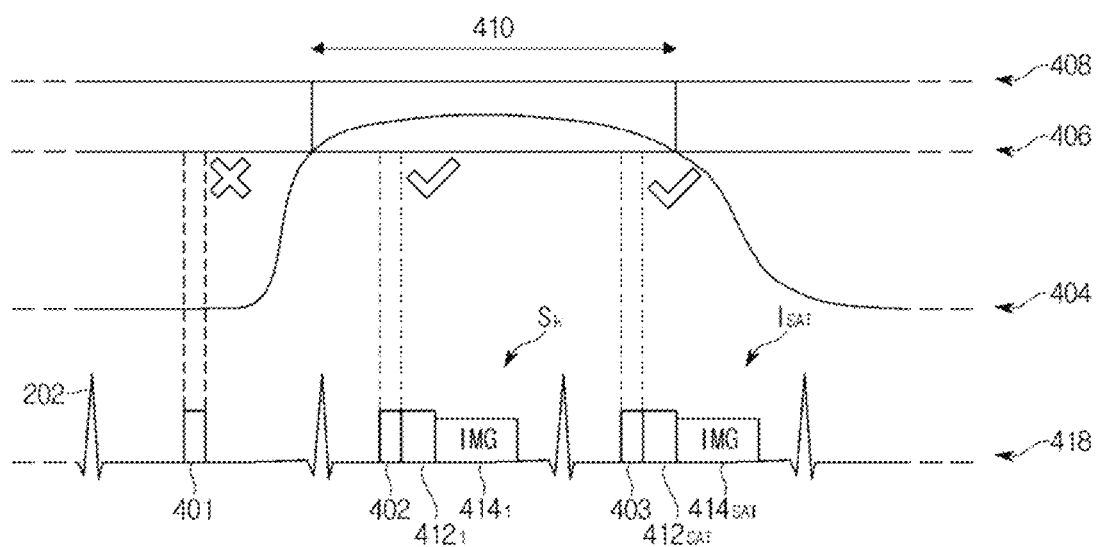
FIG. 4B is a diagram of a pulse sequence according to an exemplary embodiment.

Referring to FIG. 4B, a pulse sequence section 418 is illustrated. For example, the pulse sequence section 418 may be a section of the pulse sequence 300 described above with reference to FIG. 3A. A portion of the pulse sequence section 418 may be substantially the same as the pulse sequence section 400 described above with reference to FIG. 4A. In addition, the pulse sequence section 418 includes a navigator pulse 403 which precedes a SAT pulse $420_{SAT}$.

FIG. 4B illustrates the case where the last data acquisition block $S_M$ of the last image acquisition module $I_N$ has been performed and the navigator image data acquired using the navigator pulse 403 indicates that the position of the tracked physiological movement is within the range 410. Thus, the SAT pulse $420_{SAT}$ is executed next followed by the imaging module $414_{SAT}$.

The above-described respiratory tracking is only an example. The above-described systems and methods are applicable to various imaging applications and, as a non-limiting example, may track respiratory and/or cardiac cycles, or may use other sensors or mechanisms to trigger the imaging.

As illustrated in FIG. 3C, the first to Mth data acquisition blocks $S_1$ through $S_M$ are performed without rest periods and one image acquisition for each of different slices 302, 304, 306, 308, and 310 is executed during each data acquisition block. This is in contrast to the related art T2 mapping protocols, because, in an exemplary embodiment, the related art rest period is used for slice-selective imaging of slices located at different locations by executing the data acquisition blocks $S_1$ through $S_M$. That is, the time following the acquisition of the first slice 302 in a first data acquisition block $S_1$ is used to acquire at least one of the second through fifth slices 304, 306, 308, and 310, while the first slice 302 recovers. This allows for fast interleaved imaging without the need for extensive rest periods.

However, the recovery time for magnetization of each slice depends on the heart rate. In the described non-limiting example of five slices, the time difference between two subsequent images for the same slice is five heartbeats (i.e., 5×(R-R interval) seconds). Thus, in the case of the elevated heart rate with shorter R-R interval, the relaxation time of the slice is reduced allowing less time for recovery, which could affect the T2 weighting of the subsequent images of the same slice. Therefore, for the patients with elevated heartrates, a minimal rest period may be inserted between data acquisitions for the same slice.

For example, the rest periods with no magnetization preparation pulses or imaging pulses may be inserted before execution of all or some of the data acquisition blocks $S_1$ through $S_M$. The rest periods may be from 1 to 10 seconds, depending on a rate of the elevated heartbeat. However, this is not limiting.

The number of slices described to be imaged in an exemplary embodiment is five; however, this is not limiting. For example, to allow for signal recovery of at least five heartbeats (~5 sec for a heart rate of 60 bpm), the number of slices may be ≥5 slices to maximize the throughput of the sequence in terms of acquisition time vs. slice coverage. On the other hand, if the number of acquired slices is less than 5, rest periods may be inserted; however, the time efficiency of the sequence may be reduced. With acquiring more slices, more time between subsequent data acquisitions will result for the same slice and, thus, the rest periods of the elevated heartbeat may be omitted with an acquisition of greater number of slices.

Figure 5:
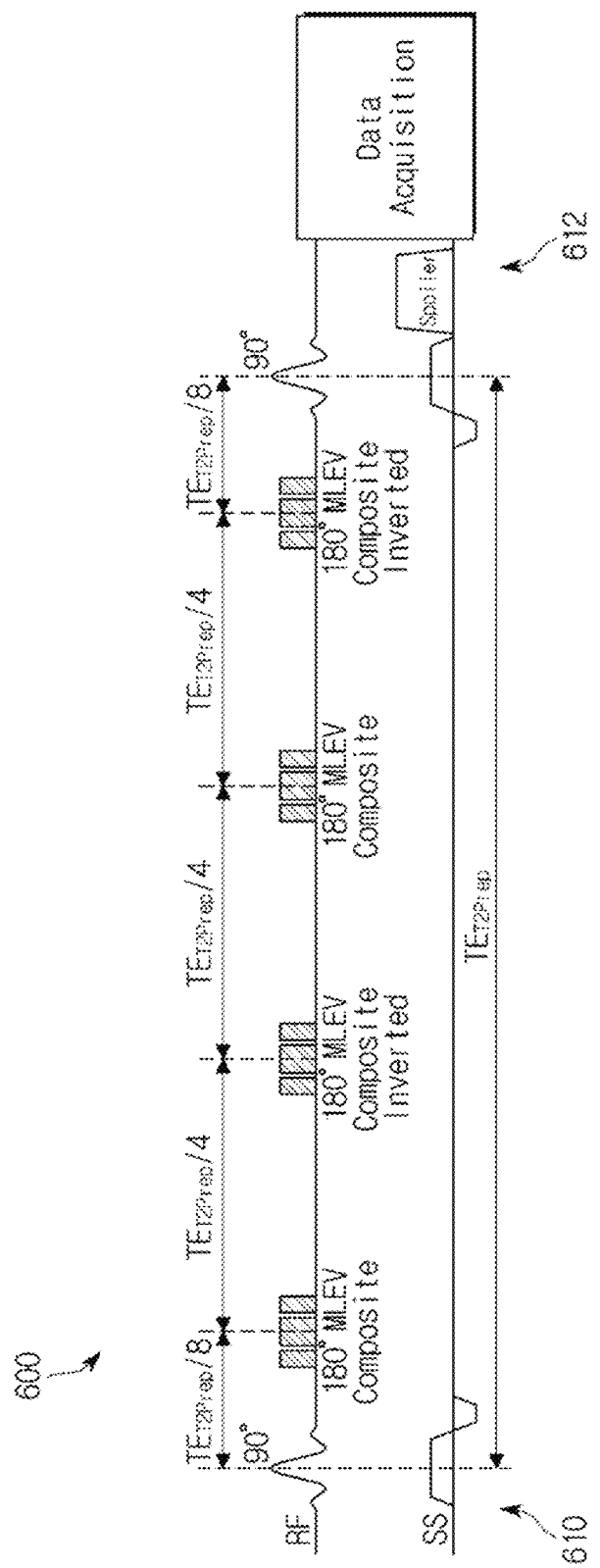
FIG. 5 is a diagram for the slice-selective T2 preparation sequence according to an exemplary embodiment.

FIG. 5 shows the sequence diagram for the slice-selective T2 preparation sequence 600 of an exemplary embodiment. The slice-selective T2 preparation sequence 600 may include a tip-down slice-selective 90° pulse 610, followed by four non-selective 180° refocusing pulses. The slice-selective T2 preparation sequence 600 concludes with a closing tip-up slice-selective 90° pulse 612. A hard-pulse may be used for the opening and closing 90° pulses with a bandwidth of 2.4 kHz and a duration of 0.88 ms. To minimize the stimulated echo artifacts that might result from playing the slice selection gradients in between two T2Prep 90° pulses, the refocusing gradient for the second 90° pulse is reversed, in order to achieve a perfect nulling for the gradients zero$^{th}$ moments in between two 90° pulses. For the refocusing pulses, composite refocusing pulses (90°x, 180°y, 90°x) may be used to provide second order corrections to variations in B1 magnetic field, and weighted in a Malcolm Levitt's (MLEV) opposing phase pairs scheme to compensate for RF pulse shape imperfections. The duration of each refocusing pulse may be 1.75 ms, but this is not limiting. MLEV technique is known to those skilled in the art and, thus, details are omitted.

Figure 6:
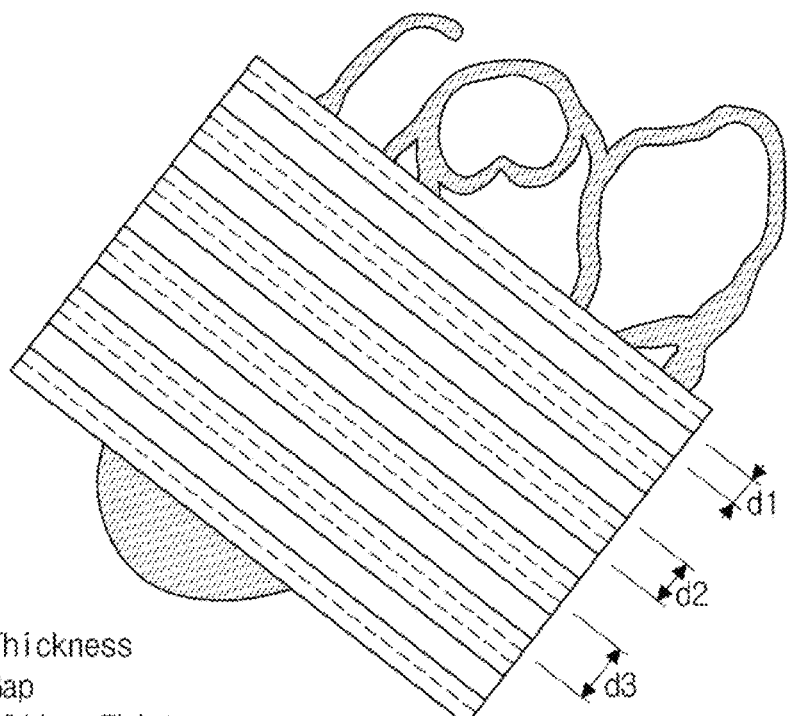
FIG. 6 illustrates slice gaps and slice thicknesses according to an exemplary embodiment.

FIG. 6 illustrates slice gaps and slice thicknesses for the T2 preparation and excitation pulses, according to an exemplary embodiment. The slice-selective 90° pulses of the T2Prep composite are applied with a slice thickness d3 which may be approximately twice as large as the thickness d1 of the imaging slice to minimize the impact of slice imperfection. A reference d2 denotes a thickness of a gap between the imaging slices.

As described above, data acquisition for different slices is interleaved to minimize slice cross-talk effects of both slice-selective T2 preparation pulse and excitation pulses. Furthermore, the acquisition of five slices allows for a recovery time of five heartbeats between two acquisitions of the same slice. Therefore, this approach removes the need for the additional 3-6 seconds rest periods used in the related art single slice T2 mapping sequences to guarantee full spin recovery before each T2Prep.

In FIG. 7, the T2-preparation sequence generator 602, the imaging sequence generator 604, the saturation sequence generator 606, and the navigation sequence generator 608 are illustrated as being incorporated into the pulse sequence controller 110. However, the pulse sequence controller 110 may omit some of the illustrated components or may have a greater number of components. Further, one or more of the T2-preparation sequence generator 602, the imaging sequence generator 604, the saturation sequence generator 606, and the navigation sequence generator 608 may be components separate from the pulse sequence controller 110.

Figure 8:
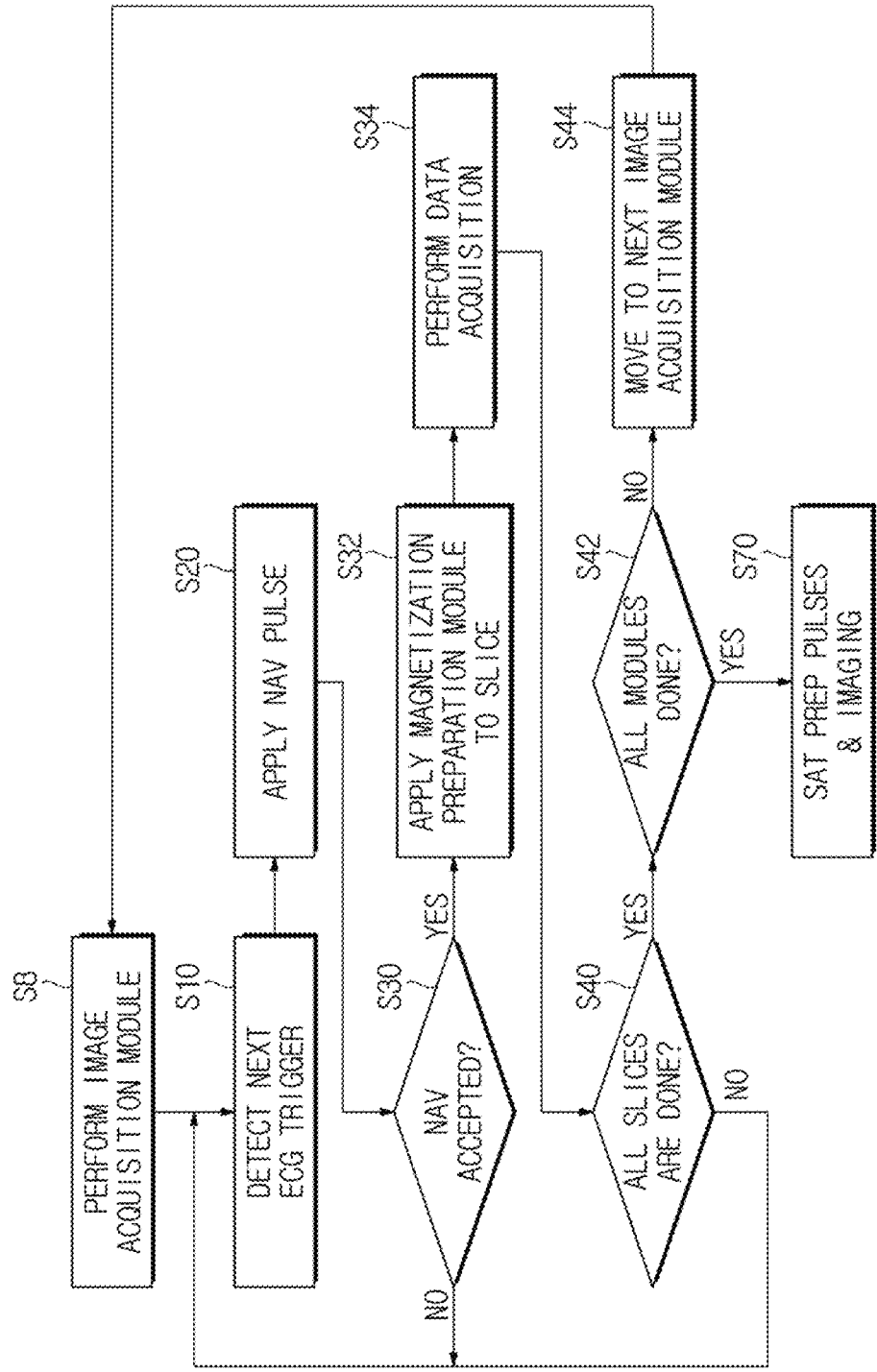
FIG. 8 is a flowchart of a method, according to an exemplary embodiment.

With reference to FIG. 8, one of the first to $N_{TH}$ image acquisition modules $I_1$ through $I_N$ may be executed in operation S8.

In operation S10, an ECG signal is detected.

In operation S20, the NAV pulse is applied, to immediately precede the T2 preparation module.

In operation S30, it is determined whether the NAV signal is outside the gating window 410, for the acquisition of one of the slices 330. If it is determined that the NAV signal is outside the gating window 410, no T2 preparation or imaging pulses are applied, and the acquisition of the slice is performed in the next R-R interval. If it is determined that the NAV signal is within the gating window 410, the T2 slice-selective magnetization preparation module is applied, with the desired T2 preparation time, in operation S32, followed by the data acquisition in operation S34.

If it is determined that not all of the slices of the current image acquisition module with the desired T2 preparation time are acquired (operation S40), the process is repeated with the next ECG signal (operation S10).

If it is determined that all of the slices of the current image acquisition module with the desired T2 preparation time are acquired (operation S40), it is determined whether all of the image acquisition modules $I_1$ through $I_N$ are performed, in operation S42.

If it is determined that not all of the image acquisition modules $I_1$ through $I_N$ are performed, the process moves to the next image acquisition module (operation S44) and is repeated with a different T2 preparation time by executing the next image acquisition module (operation S8).

If it is determined that all of the image acquisition modules $I_1$ through $I_N$ with all of the desired T2 preparation times are performed, the SAT pulse is applied and a saturation-prepared (SAT) image is acquired in operation S70. The SAT pulse may be applied subsequently to the navigator pulse which is applied with a time delay after the ECG signal.

By using selective excitation for the acquisition of each of the slices 302, 304, 306, 308, and 310, each subsequent slice acquisition only perturbs the magnetization in a single slice, while the other slices remain unperturbed. Thus, as described above, sampling for different slices is achieved without the need for the rest periods, resulting in a substantially reduced scan time.

After performing the described-above data acquisition method by using the exemplary multi-slice sequence that acquires multiple sets of single-shot images of different slices 330, the image reconstruction may be performed, for example, by the image processor 152. The acquired data may be applied to a desired model which may be selected based on various criteria, tradeoffs and/or consideration and may be used by the data processor 114, the curve fitter 150, and/or image processor 152.

In accordance with an exemplary embodiment, the T2 maps are generated by a curve fitter 150 by using a three-parameter fit model.

When the images with different T2-weights are acquired, several imaging pulses are applied until the center of k-space is acquired. These imaging pulses cause the magnetization to reach a steady state that is different than the equilibrium magnetization. The difference may be characterized using a three-parameter model in accordance with an exemplary embodiment that takes the form:

$$S(t)=Ae^{(-t/T2)}+B, \qquad \text{Equation (3)},$$

where S is a signal intensity at a given location,

A is a base parameter that, for example, includes the equilibrium magnetization and local receiver coil gain, t is a T2-preparation echo time, and B is an additional offset parameter due to a T1 recovery effect during an image acquisition window.

The curve fitter 150 processes the acquired T2-weighted images, i.e., images weighted with different T2 echo times, and the saturation-prepared image, to fit the T2-decay curve by using the three-parameter model at each pixel, to yield a T2 map, which may be displayed as an image to a user. For example, a displayed image may be a color image.

In particular, the use of the SAT pulses in the exemplary sequences allows for an accurate fitting of a B offset in the case of the three-parameter model, which captures the effect of the imaging pulses. Imaging after a SAT pulse simulates an acquisition where all magnetization history is erased, i.e., a complete T2 decay, followed by the imaging pulses in the saturation imaging acquisition. That is, to estimate the offset value B, the above-described sequences and similar sequences include an imaging module executed after a saturation pulse SAT, which simulates acquisition at a very long $TE_{T2P}$, i.e., an equivalent of an image with $TE_{T2P}$ equal to infinity, to obtain a saturation-prepared image which captures the effect of the imaging pulses on the magnetization curve and improves the estimation of the offset parameter B. In case of any flip angle imperfection, this method helps to uniformly having the same effect across all T2Prep images, and thus minimizes its impact on the fitting process, and subsequently on the final estimated T2 times.

Thus, the use of the above-described pulse sequences or similar sequences and the three-parameter model of Equation 3 creates a fitting construct that allows for accurate characterization of T2 times.

After the desired model is selected and used, a report may be generated that, for example, includes a T2 map created using the acquired data.

The accuracy, precision, and reproducibility of the new pulse sequence were studied and the results are described below. The exemplary free-breathing multi-slice T2 mapping sequence allows T2 measurements of five left ventricular slices in 20 heartbeats with similar reproducibility and precision as a related art single-slice T2-mapping sequence but with 4-folds improvement in data acquisition efficiency.

Phantom Imaging

A phantom study was performed to characterize the accuracy, precision, and reproducibility of the T2 times using a 32-channel cardiac coil array.

In a phantom imaging experiment, the estimated T2 times obtained with the above-described sequence and a related art single-slice sequence with no slice-selective T2Prep were compared. The phantom included $NiCl_2$ doped agarose vials, whose T2 and T1 values spanned the ranges of values found in the blood and myocardium. A single-shot ECG-triggered steady-state free precession (SSFP) sequence was used for imaging in the above-described multi-slice T2 mapping sequence with the following parameters: five slices, FOV=240×240 $mm^2$, in-plane resolution=2×2 $mm^2$, slice thickness=8 mm, TR/TE=2.2 ms/1.1 ms, flip angle=40°, 10 linear ramp-up pulses, SENSE rate=2, acquisition window=138 ms, number of phase encoding lines=51, linear k-space ordering. Three different $TE_{T2P}$ images were acquired at different $TE_{T2P}$=0, 25, and 50 ms, in addition to a single image after a saturation pulse to simulate $TE_{T2P}=\infty$ (total of four images per slice).

For comparison, a 2D single slice T2 mapping sequence was performed using the related art non-selective T2Prep sequence to image one slice of the phantom which corresponded to the middle slice of the exemplary sequence five slices, i.e., third slice. The same imaging and $TE_{T2P}$ timing parameters were used for the related art non-selective T2Prep sequence, but with a four-second rest period after each image to allow for full spins recovery. T2 values were calculated using a three-parameter fit model, as described above. To assess for measurement reproducibility, each sequence was repeated 10 times in a random order. Additionally, a Carr-Purcell-Meiboom-Gill (CPMG) spin-echo sequence with an echo train length of 32 and TE=10 ms was performed as reference. The scan parameters were: FOV=240×240 $mm^2$, in-plane resolution=1.25×1.25 $mm^2$, slice thickness=4 mm, TR=6000 ms, flip angle=90°, number of averages=4. Reference T2 values were obtained from a two-parameter model fit to the spin echo signal.

In Vivo Imaging

Ten healthy adults (29.2±17.8 years, range: 19-70 years, 4 males) were recruited. Additionally, 28 patients (59±16 years, 18 males) referred for clinical CMR were also recruited to demonstrate the feasibility of the exemplary multi-slice T2 mapping sequence in patients by acquiring a single multi-slice T2 mapping sequence. Each healthy subject was imaged with the exemplary multi-slices T2 mapping sequence with the slice-selective T2Prep and the related art single-slice T2 mapping sequence with no slice-selective T2Prep. To assess for reproducibility, each sequence was acquired 5 times for each subject. Both sequences were performed under free breathing conditions and used a 2D pencil-beam NAV positioned on the right hemi-diaphragm (RHD) to track the breathing motion and prospectively correct for the slice position during imaging. The NAV tracking used a 2D spatially selective spiral pulse, with 16 spiral excitation turns in 10 ms, and a flip angle of 90° to excite the magnetization in a circular area centered on the RHD with a diameter of 50 mm. All scans were acquired in the short axis orientation.

The exemplary sequence used a free-breathing single-shot ECG-triggered slice-selective T2Prep balanced (bSSFP) acquisition with the following parameters: five slices, FOV=320×320 $mm^2$, in-plane resolution=2.5×2.5 $mm^2$, slice thickness=8 mm, slice gap=4 mm, TR/TE=2.2 ms/1.1 ms, flip angle=40°, 10 linear ramp-up pulses, SENSE rate=2, acquisition window=140 ms, number of phase encoding lines=67, linear k-space ordering. Similar to the phantom experiment, three images were acquired with $TE_{T2P}$=0, 25, and 50 ms, in addition to the SAT image (total 4 images per slice). The acquisition time of this sequence was 20 heartbeats.

The related art T2 mapping sequence was performed to image one 2D single slice corresponding to the middle slice of exemplary sequence using the same imaging and $TE_{T2P}$ timing parameters as the exemplary sequence but with non-selective T2Prep pulses. The related art single-slice sequence used a four-second rest period after each T2-weighted image acquisition to allow for a full spin recovery. The acquisition time was 13 heartbeats.

Data Analysis

For phantom data, the voxel-wise T2 maps were generated using a three-parameter fitting model. Accuracy, precision and reproducibility were evaluated as follows. A region-of-interest (ROI) was manually defined for each vial in the spin echo data ($ROI_{SE}$). Similarly, a second ROI was defined for each vial in the data obtained with two studied sequences (ROIseq). Accuracy was measured for each vial (v) as the difference between the average (over the 10 repetitions) of the mean T2 in ROIseq(v) and the mean reference T2 in $ROI_{SE}$(v). Precision was measured for each vial (v) as the average (over the 10 repetitions) of the T2 standard deviation in ROIseq(v). Reproducibility was measured for each vial (v) as the standard deviation (over the 10 repetitions) of the mean T2 in ROIseq(v).

For the in-vivo data, images were registered retrospectively using a non-rigid image registration algorithm to compensate for residual in-plane motion, as described, for example, in an article entitled "Adaptive registration of varying contrast-weighted images for improved tissue characterization (ARCTIC): Application to T1 mapping" by Roujol S, Foppa M, Weingartner S, Manning W J, Nezafat R, Magnetic Resonance in Medicine (2014). This algorithm simultaneously estimates a non-rigid motion field and intensity variations, and employs an additional regularization term to constrain the deformation field using automatic feature tracking.

Upon registration, voxel-wise curve-fitting was performed, to generate T2 maps using a three-parameter fitting model. Then, a myocardial segment based analysis was performed following the AHA myocardial segment model. Epi- and endocardial contours were drawn manually by an experienced reader for each T2 map in all slices. The myocardium was divided into 16 segments for the multi-slice results (using the three mid-ventricular slices), and 6 segments for the single slice results. For each subject and segment, the average and standard deviation of T2 values were calculated. The standard deviation served as a surrogate of the precision. For each subject, the standard deviation (over the five repetitions) of the mean T2 values of each segment was calculated and served as a surrogate of the reproducibility. All calculations were performed using Matlab (v7.14, The MathWorks, Natick, Mass.).

For the patients data, the most apical and most basal slices were excluded, and the bullseye quantifications were calculated based on the middle three slices.

Statistical Analysis

Paired Student t-test was used to compare the accuracy, precision and reproducibility of the exemplary sequence, and the related art single slice sequence in both the phantom study and the in-vivo measurements with statistical significance threshold defined at p<0.05. In the in-vivo study, a one-way ANOVA test was used to compare the T2 measurements at different myocardial levels (specifically, basal, mid and apical levels) with the same statistical significance threshold defined at p<0.05.

Figure 9:
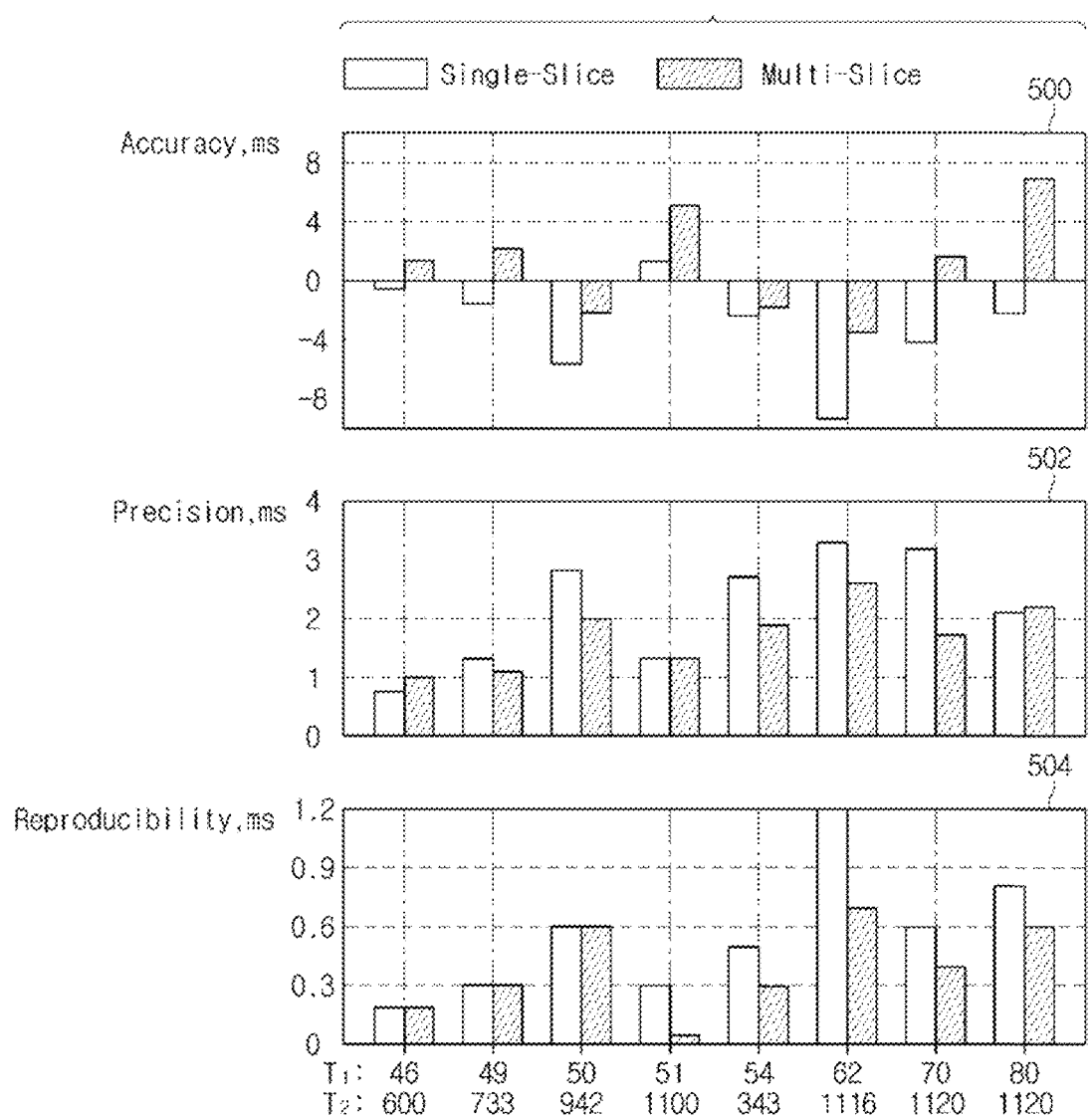
FIG. 9 shows graphs of T2 measurements in different phantom vials with different T1 and T2 times.

FIG. 9 shows graphs 500, 502, and 504 that, respectively, show the accuracy, precision, and reproducibility of T2 measurements obtained in the phantom study using the related art single slice and the exemplary multi-slice T2 mapping sequences, by using a set of phantom vials with different T1/T2 values. Each sequence was repeated 10 times. Accuracy was defined as the difference between the averaged T2 times over all 10 repetitions and the spin echo T2 measurements. Precision was defined as the average over all 10 repetitions of the T2 standard deviation within each vial. Reproducibility was defined as the standard deviation over all 10 repetitions of the mean T2 times within each vial. The exemplary multi-slice sequence yields similar absolute accuracy (p=0.915), precision (p=0.26), and reproducibility (p=0.29) as compared with the single-slice sequence.

For the vials with T2 matching the range of normal myocardium (i.e., T2=40 to 60 ms), the multi-slice T2 values were within 5 ms from the spin echo measurements and within 9 ms for the single-slice sequence. Across all vials, the multi-slice T2 measurements were lower than the single slice measurements (p<0.05), but similar to the spin echo measurements (p=0.24). No significant differences were found in the precision and reproducibility between the two sequences for any of the vials (p=0.26, 0.29 respectively).

Figure 10A:
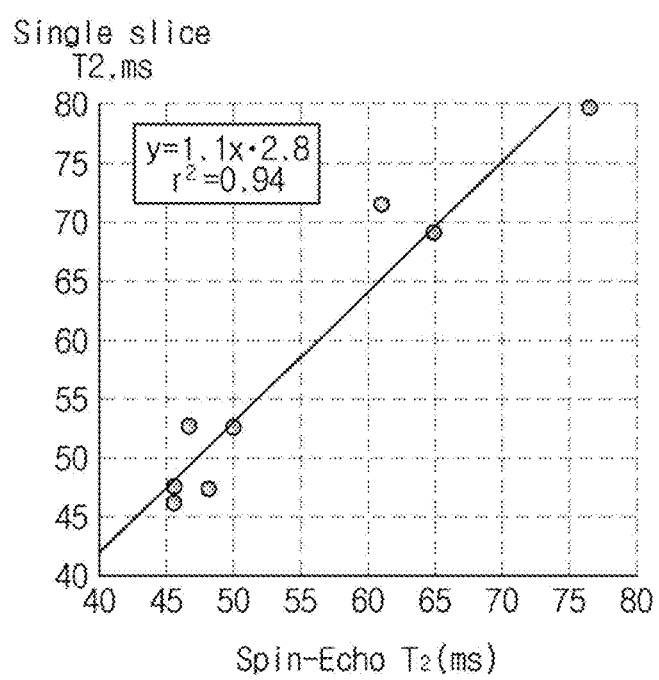
FIGS. 10A, 10B, and 10C show the regression analysis.
Figure 10B:
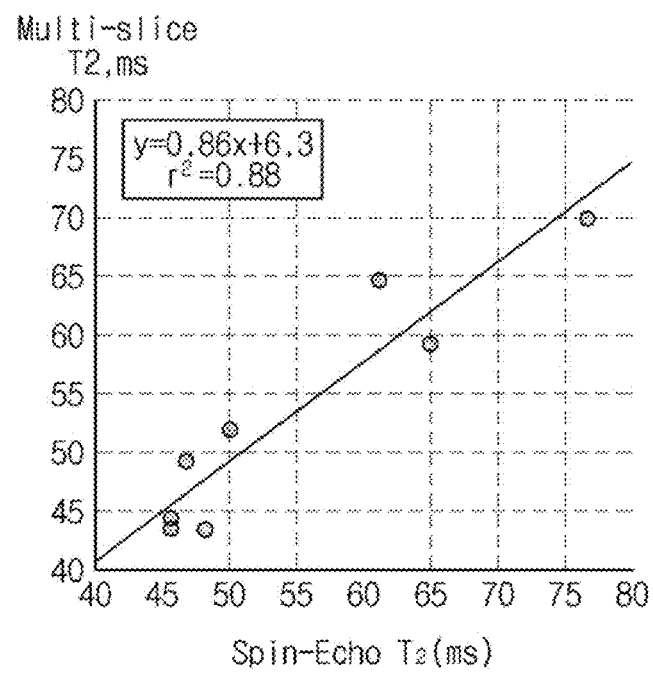
Figure 10C:
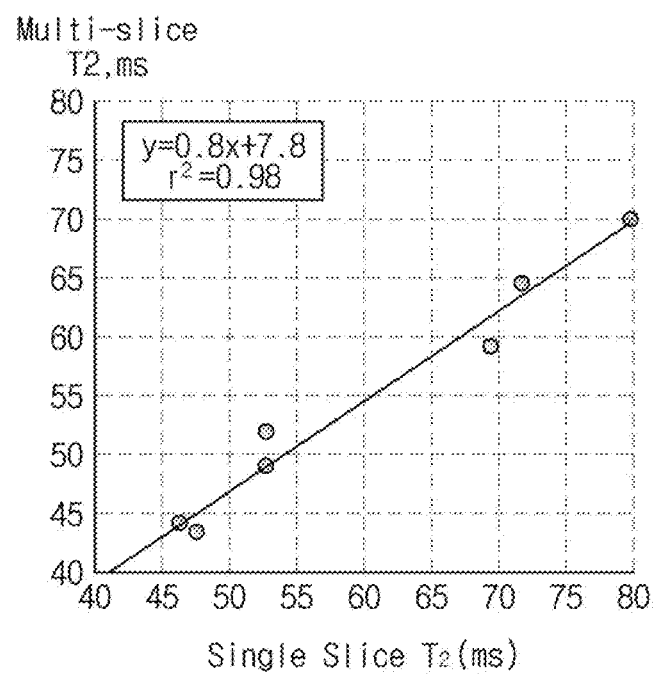

FIGS. 10A and 10B show the regression analysis between the reference T2 values measured from the spin echo images (x-axis) and the mean of the estimated T2 values across repetitions (y-axis) using the related art single-slice sequence and the exemplary multi-slice sequence, respectively. FIG. 10C shows the regression analysis obtained between the T2 measurements of the related art single-slice sequence and the exemplary multi-slice sequence.

The multi-slice measurements exhibit a good correlation with both spin echo and single slice measurements ($r^2$=0.88 and 0.98 respectively). There is a strong correlation ($r^2$=0.98) between the T2 values measured from single vs. multi-slice sequences with a regression slope of 0.8 indicating slightly lower T2 values when using the multi-slice sequence, as compared with the single slice sequence.

Figure 11:
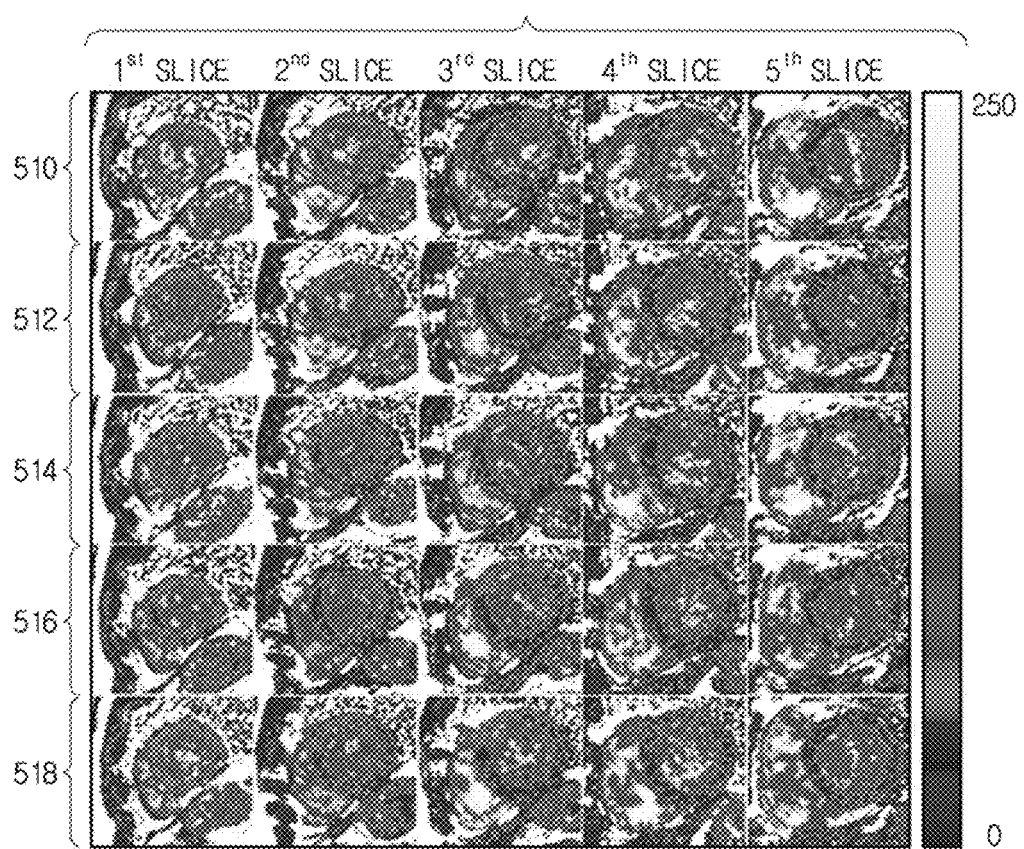
FIG. 11 shows example of T2 maps.

FIG. 11 shows example of in-vivo T2 maps obtained with first through fifth repetitions (reference numerals 510, 512, 514, 516, and 518) of the exemplary sequence in one healthy subject. The maps visually appear homogeneous over all slices and myocardial segments, thus demonstrating a low spatial variability of T2 values. The quality of the exemplary multi-slice T2 mapping sequence appears visually similar over the five repetition scans, thus demonstrating a good reproducibility of the exemplary method.

Figure 12A:
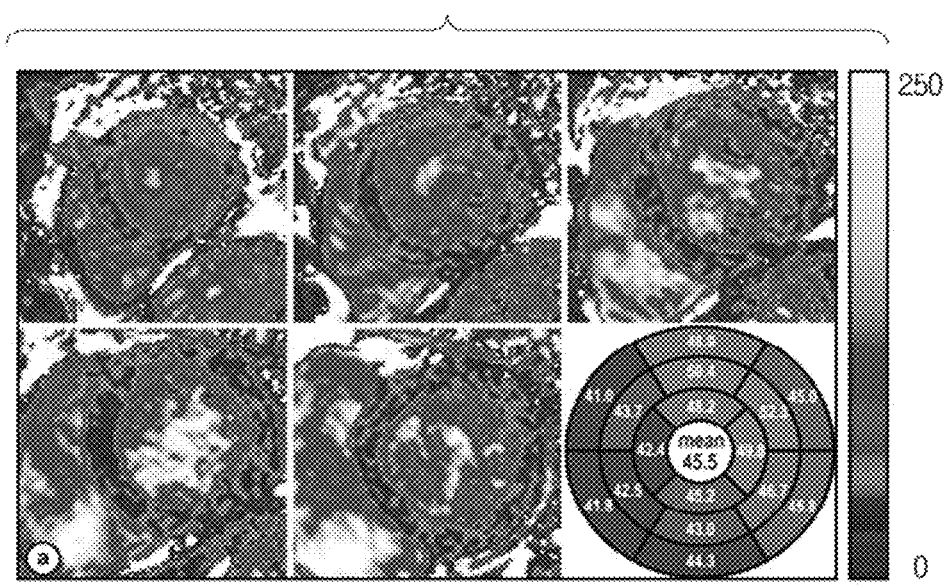
FIGS. 12A and 12B show an example of T2 quantifications.
Figure 12B:
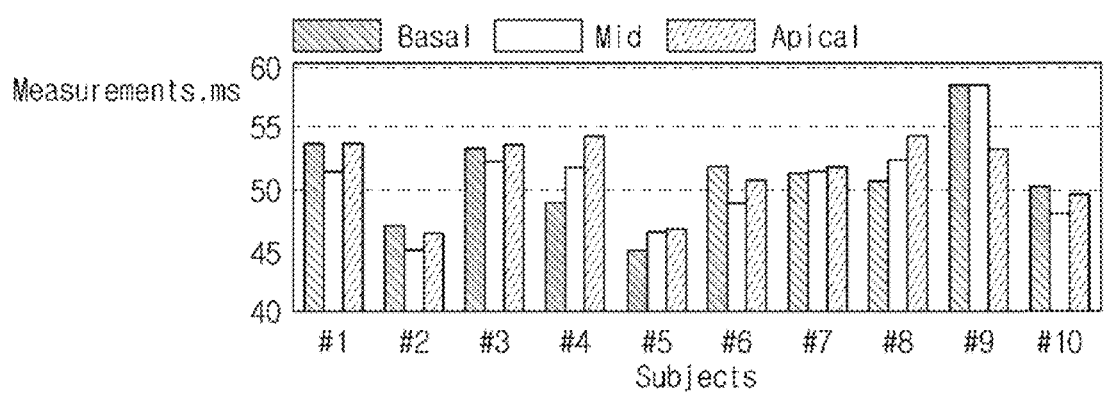

FIGS. 12A and 12B show an example of the T2 quantifications based on the exemplary multi-slice sequence.

FIG. 12A shows the bullseye of the T2 quantifications obtained in one healthy subject from one of five repetitions.

FIG. 12B shows the average T2 values at different cardiac levels (basal, mid and apical levels) for all healthy objects between multi-slice T2 mapping sequence vs. single slice T2 mapping sequence. The ANOVA test resulted in non-significant differences between the T2 values across the three ventricular levels (p=0.54).

Figure 13:
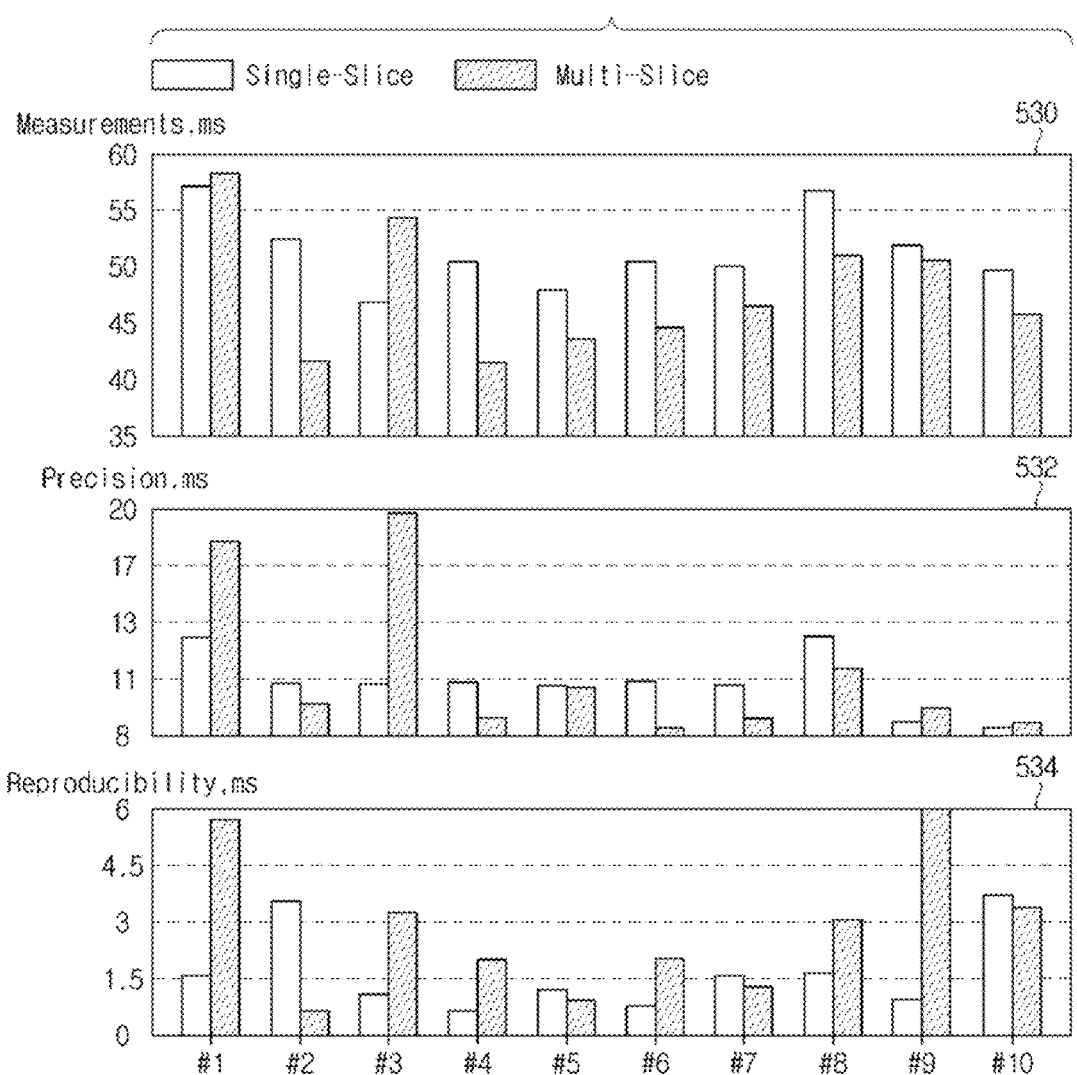
FIG. 13 shows graphs of in-vivo T2 quantifications.

FIG. 13 shows the object-based analysis of in-vivo T2 quantifications over the entire myocardium in 10 healthy objects. Graphs 530, 532, and 534 respectively show the T2 measurements, precision, and reproducibility of the multi-slice and single slice sequences obtained for each subject. Accuracy, precision and reproducibility were measured over the entire mid-ventricular slice in the multi-slice and the single slice sequence. Over the entire myocardium, on average, similar T2 values measurements (48±5.6 ms vs. 51±3.4 ms using single slice sequence, p=0.1), precision (11±4.0 ms vs. 10±1.5 ms, p=0.6) and reproducibility (3±1.8 ms vs. 1.7±1 ms, p=0.11) were obtained in the multi-slice sequence compared to the single slice sequence.

Figure 14A:
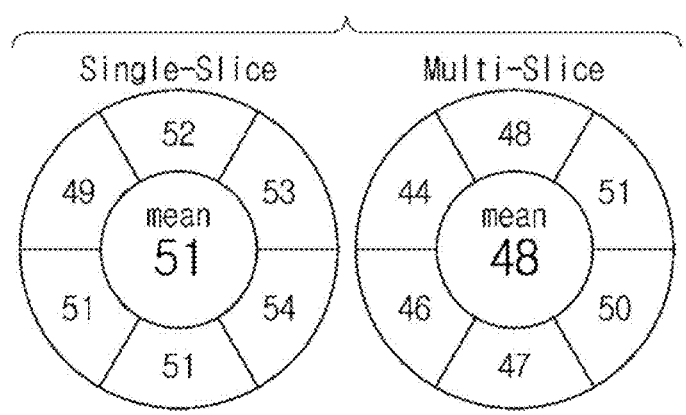
FIGS. 14A, 14B, and 14C show the myocardial segment-based analysis of T2 mapping.
Figure 14B:
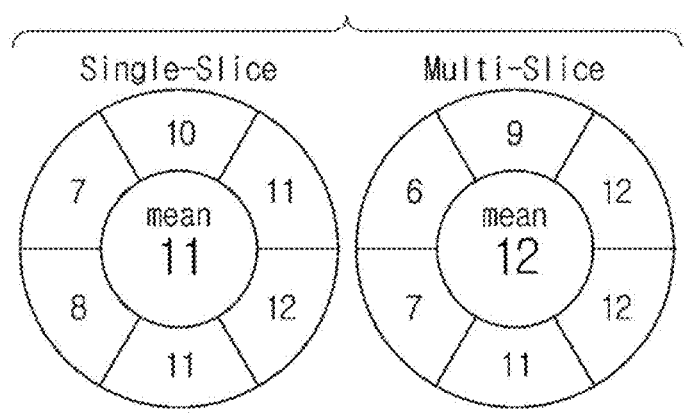
Figure 14C:
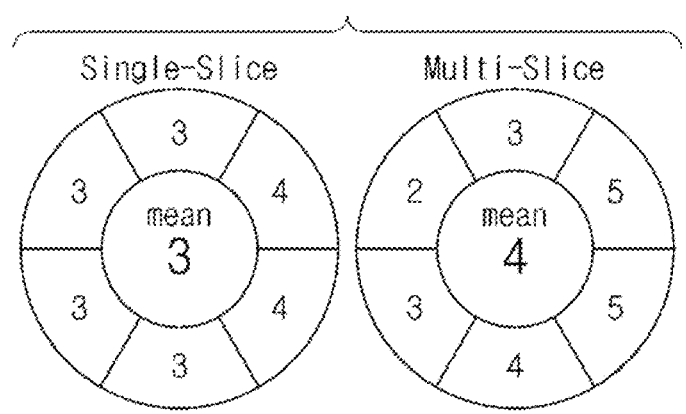

FIGS. 14A, 14B, and 14C show the in-vivo myocardial segment-based analysis of T2 mapping in healthy objects for measurements, precision, and reproducibility, respectively.

The values in each bullseye center represent the measurement value over the entire myocardium and not the average of the segments values. The exemplary multi-slice sequence measurements led to lower segment-wise T2 values (48±3 ms vs 51±2 ms, p<0.05) and similar range of precision (9.8±2 ms vs. 9.5±3 ms, p=0.36) and reproducibility (3.3±0.5 ms vs. 3.7±1.2 ms, p=0.08) when compared with the single slice sequence measurements.

High precision of T2 measurements was obtained in septal segments when compared to free-wall segments for both sequences (7.5 ms vs. 11.5 ms, p<0.05 in the single slice sequence, and 6.5 ms vs 12 ms, and p<0.05 in the multi-slice sequence). As shown in FIG. 14C, reproducibility is also better in the septal segments in the multi-slice sequence (2.5 ms vs. 5 ms, p<0.05), but is not significantly different between septal and free-wall segments in the single slice sequence (3 ms vs. 4 ms, p=0.33).

Figure 15A:
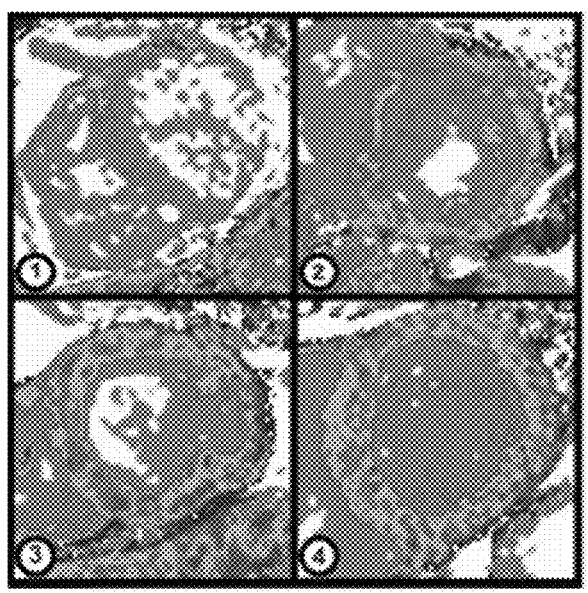
FIGS. 15A and 15B show subjective qualitative analysis of overall slice-based T2 map quality in objects.
Figure 15B:
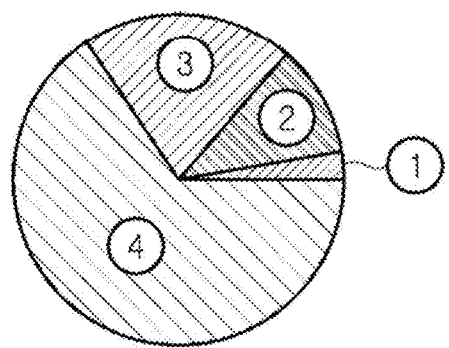

FIGS. 15A and 15B show subjective qualitative analysis of overall slice-based T2 map quality in objects. The quality was assessed by the consensus of two experienced readers using a slice-based four-point scale that addresses the T2-weighted image quality, registration quality, and the final T2 maps quality, as described below.

FIG. 15A illustrates the four-point scale used for the assessment: 1 is given to a non-diagnostic T2 map (very low confidence in the map due to severe motion artifacts or bad image registration), 2 is a given to a fair T2 map (low confidence in two or three segments of the map, but high confidence in the rest), 3 is given to a good T2 map (most of the map is excellent except for small localized areas of artifact in at most one segment), and 4 is given to an excellent T2 map (high confidence in all segments in the map).

FIG. 15B shows overall scores obtained for imaging of 28 patients with 84 slice maps.

As shown in FIG. 15B, about 86% of the T2 maps obtained with the exemplary multi-slice sequence were of good to excellent image quality.

As described above, the exemplary embodiments provide a novel free-breathing multi-slice myocardial T2 mapping sequence by implementing a slice-selective T2Prep sequence in combination with an interleaved slice acquisition scheme. Thus, the scan time may be substantially reduced and the data acquisition efficiency may be substantially increased, to allow the coverage of more slices in a comparable scan time of one single slice acquired using the related art single slice T2 mapping sequence which does not use a slice-selective T2Prep sequence. A 20 heartbeat free-breathing T2 mapping sequence with five slices of LV coverage can be easily integrated in any clinical CMR imaging protocol as demonstrated by the above-discussed examples.

The exemplary multi-slice T2 mapping sequence is acquired during free breathing. For example, at least one of a prospective slice-tracking to minimize through plan motion and a retrospective motion correction to reduce the impact of in-plane motion may be used during free-breathing T2 imaging, as described above.

The exemplary sequence can easily be adapted for segmented data acquisition for myocardial T2-mapping to acquire higher spatial resolution 2D mapping. The data acquisition for different k-space segments may be interleaved in the same fashion the slices are interleaved in the exemplary sequence, and thus can be used in a time-efficient way to acquire the entire 2D k-space data.

As described above, the exemplary embodiments provide an MRI pulse sequence for imaging multi-slice T2 maps. The sequence includes sampling the images with different T2 weightings, generated using slice-selective T2Prep pulses. This allows for a fast interleaved multi-slice acquisition with no need for rest periods for magnetization recovery after the acquisition of each image, as in the related art, since different slices can be acquired during the spin recovery in the last acquired slice.

Thus, for cardiac imaging, the exemplary embodiments provide a free-breathing multi-slice T2 mapping sequence by combining a new slice-selective T2Prep composite pulse with slice interleaved ECG-triggered SSFP imaging.

Although one or more exemplary embodiments are described above as using a cardiac gated acquisition and a navigator pulse to gate the heartbeat and/or breathing, the exemplary embodiments are not limited thereto. For example, the described-above is applicable in imaging of organs and tissues which do not require the cardiac gating and/or the breathing gating, as for example, a brain or a liver. For example, an ECG signal and/or breathing signal may be omitted from the described above sequencing and other physical, hardware, or software signal may be used as a trigger and/or for gating.

Exemplary embodiments may be implemented by software or hardware components such as a field-programmable gate array (FPGA) or an application-specific integrated circuit (ASIC). The hardware component may include a storage medium capable of addressing, or may be configured to be executed by one or more processors. Software component may include object-oriented software components, class components, and task components, and processes, functions, attributes, procedures, subroutines, segments of a program code, drivers, firmware, a micro code, a circuit, data, a database, data structures, tables, arrays, and variables. Functions provided by different components may be combined into a smaller number of components or may be further separated into additional components.

The foregoing exemplary embodiments and advantages are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A magnetic resonance imaging (MRI) method comprising:
    performing a first image acquisition module of a pulse sequence to acquire a first MR data from slices disposed at different locations in a region of interest (ROI) of an object, by applying, to each of the slices, a slice-selective magnetization preparation module and an imaging module, the slice-selective magnetization preparation module being executed with a first T2 preparation time having a first time echo;
    performing a second image acquisition module of the pulse sequence, to acquire a second MR data from the slices disposed at the different locations of the ROI, by applying, to each of the slices, the slice-selective magnetization preparation module and the imaging module, the slice-selective magnetization preparation module being executed with a second T2 preparation time having a second time echo different from the first time echo;
    generating a T2 map based on the first MR data and the second MR data; and
    displaying the T2 map as a viewable medical image of the ROI.

2. The method of claim 1, wherein the pulse sequence includes consecutive data acquisition blocks spanning over the first image acquisition module and the second image acquisition module, and
    each of the consecutive data acquisition blocks is associated with an MR data acquisition of one slice and includes the slice-selective magnetization preparation module followed by the imaging module, of the first image acquisition module or the second image acquisition module.

3. The method of claim 2, wherein each of the consecutive data acquisition blocks is a single-shot acquisition block configured to acquire a single image of one of the slices of the ROI, and
    each subsequent data acquisition block of the consecutive data acquisition blocks is executed while omitting a rest period after an execution of a preceding data acquisition block.

4. The method of claim 1, wherein the performing the first image acquisition module and the second image acquisition module include:
    performing a navigator module to acquire navigator image data immediately before performing the slice-selective magnetization preparation module for each of the slices in the first image acquisition module and for each of the slices in the second image acquisition module, respectively, to acquire the first MR data and the second MR data during a free-breathing of the object.

5. The method of claim 4, wherein the generating the T2 map includes performing prospective gating based on the navigator image data.

6. The method of claim 1, wherein
    the applying the slice-selective magnetization preparation module in the first image acquisition module includes applying, to each of the slices, T2-preparation pulses and associated slice-selective pulses, to acquire the first MR data which is T2-weighted with the first T2 preparation time for all of the slices selected by the slice-selective pulses in an execution of the first image acquisition module, and
    the applying the slice-selective magnetization preparation module in the second image acquisition module includes applying to each of the slices, T2-preparation pulses and associated slice-selective pulses, to acquire the second MR data which is T2-weighted with the second T2 preparation time different from the first T2 preparation time, for all of the slices selected by the slice-selective pulses in an execution of the second image acquisition module.

7. The method of claim 6, wherein each of the slice-selective pulses selectively excites each subsequent slice during a recovery period of a preceding slice, of the slices included in the ROI.

8. The method of claim 6, further comprising:
gating an MR data acquisition of each of the slices based on a cardiac cycle of the object,
wherein each of the slice-selective pulses is performed at a corresponding location in the cardiac cycle of the object.

9. The method of claim 1, wherein the generating includes:
generating the T2 map by using a T2-relaxation model based on a three-parameter model for a T2 decay that models an image signal relative to a base intensity parameter, a T2 value, and an offset parameter to determine the T2 value at a plurality of locations as:

$$S(t)=Ae^{(-t/T2)}+B$$

where S is an intensity of the image signal at a given location in the plurality of locations,
A is the base intensity parameter,
t is a T2-preparation time, and
B is the offset parameter which compensates for a T1 recovery effect during an image acquisition.

10. The method of claim 1, wherein the first image acquisition module and the second image acquisition module are included into a plurality of image acquisition modules included into the pulse sequence, to acquire a plurality of MR data, respectively, from the slices included in the ROI,
each of the plurality of image acquisition modules includes associated slice-selective magnetization preparation modules each being followed by a respective imaging module,
each of the associated slice-selective magnetization preparation modules includes T2-preparation pulses and associated slice-selective pulses, to acquire the plurality of MR data which is variously T2-weighted for each of the plurality of image acquisition modules and which is weighted with a same T2-weight for all of the slices selected by the slice-selective pulses in a same image acquisition module, and
the first MR data and the second MR data are included into the plurality of MR data.

11. The method of claim 10, further comprising:
applying a saturation pulse sequence to the ROI after a last image acquisition module of the plurality of image acquisition modules has been executed; and
applying imaging pulses following the saturation pulse sequence, to acquire a T2-weighted data which is weighted with a long T2 preparation time simulating infinity, from the slices of the ROI,
wherein the last image acquisition module is executed last among the plurality of image acquisition modules.

12. A magnetic resonance imaging (MRI) apparatus comprising:
a pulse sequence controller configured to generate a pulse sequence and apply the pulse sequence to a gradient coil assembly and an RF coil assembly, the pulse sequence including:
a first image acquisition module to acquire a first MR data from slices disposed at different locations in a region of interest (ROI) of an object, the first image acquisition module comprising a slice-selective magnetization preparation module and an imaging module, the slice-selective magnetization preparation module being applied to each of the slices with a first T2 preparation time having a first time echo, and
a second image acquisition module of the pulse sequence, to acquire a second MR data from the slices, the second image acquisition module comprising the slice-selective magnetization preparation module and the imaging module, the slice-selective magnetization preparation module being applied to the each of the slices with a second T2 preparation time having a second time echo different from the first time echo; and
an image processor configured to generate a T2 map based on the first MR data and the second MR data.

13. The apparatus of claim 12, wherein the pulse sequence controller is configured to generate the pulse sequence to include consecutive data acquisition blocks each including the slice-selective magnetization preparation module followed by the imaging module of the first image acquisition module and the second image acquisition module, respectively, associate each of the consecutive data acquisition blocks with an MR data acquisition from one slice, and execute the consecutive data acquisition blocks in the first image acquisition module and in the second image acquisition module.

14. The apparatus of claim 13, wherein each of the consecutive data acquisition blocks is a single-shot acquisition block configured to acquire a single image of one of the slices of the ROI, and
each subsequent data acquisition block of the consecutive data acquisition blocks is performed by omitting a rest period after an execution of a preceding data acquisition block.

15. The apparatus of claim 13, the wherein the pulse sequence controller is configured to execute a navigator module to acquire navigator image data immediately preceding the slice-selective magnetization preparation module for each of the slices in the first image acquisition module and for each of the slices in the second image acquisition module, respectively, to acquire the first MR data and the second MR data during a free-breathing of the object.

16. The apparatus of claim 15, wherein the image processor is configured to generate the T2 map by performing prospective gating based on the navigator image data.

17. The apparatus of claim 12, wherein the pulse sequence controller is configured to
apply the slice-selective magnetization preparation module for each of the slices in the first image acquisition module, as T2-preparation pulses and associated slice-selective pulses, to acquire the first MR data which is T2-weighted with the first T2 preparation time for all of the slices selected by the slice-selective pulses in an execution of the first image acquisition module, and
apply the slice-selective magnetization preparation module for each of the slices in the second image acquisition module, as T2-preparation pulses and associated slice-selective pulses, to acquire the second MR data which is T2-weighted with the second T2 preparation time different from the first T2 preparation time, for all of the slices selected by the slice-selective pulses in an execution of the second image acquisition module.

18. The apparatus of claim 17, wherein each of the slice-selective pulses selectively excites each subsequent slice during a recovery period of a preceding slice, of the slices included in the ROI.

19. The apparatus of claim 17, further comprising a sensor configured to detect a cardiac cycle of the object, and the pulse sequence controller is configured to gate an MR data acquisition of each of the slices based on the cardiac cycle of the object, and execute each of the slice-selective pulses at a corresponding location in the cardiac cycle of the object.

20. The apparatus of claim 12, wherein the image processor is configured to generate the T2 map by using a T2-relaxation model based on a three-parameter model for a T2 decay that models an image signal relative to a base intensity parameter, a T2 value, and an offset parameter to determine the T2 value at a plurality of locations as:

$$S(t)=Ae^{(-t/T2)}+B$$

where S is an intensity of the image signal at a given location in the plurality of locations,
A is the base intensity parameter,
t is a T2-preparation time, and
B is the offset parameter which compensates for a T1 recovery effect during an image acquisition.

21. The apparatus of claim 12, wherein the first image acquisition module and the second image acquisition module are included into a plurality of image acquisition modules included into the pulse sequence, to acquire a plurality of MR data, respectively, from the slices included in the ROI,
each of the plurality of image acquisition modules includes associated magnetization preparation modules each being followed by a respective imaging module,
each of the associated magnetization preparation modules includes T2-preparation pulses and associated slice-selective pulses, to acquire the plurality of MR data which is variously T2-weighted in each of the plurality of image acquisition modules and which is weighted with a same T2-weight for all of the slices selected by the slice-selective pulses in a same image acquisition module, and
the first MR data and the second MR data are included into the plurality of MR data.

22. The apparatus of claim 21, wherein the pulse sequence controller is configured to apply a saturation pulse sequence to the ROI after a last image acquisition module of the plurality of image acquisition modules has been executed, and to apply imaging pulses following the saturation pulse sequence, to acquire a T2-weighted data which is weighted with a long T2 preparation time simulating infinity, from the slices of the ROI, and the last image acquisition module is executed last among the plurality of image acquisition modules.

23. A non-transitory computer-readable storage medium having recorded thereon a computer program which, when executed by a computer of a magnetic resonance imaging (MRI) system, causes the computer to execute a method comprising:
performing a first image acquisition module of a pulse sequence to acquire a first MR data from slices disposed at different locations in a region of interest (ROI) of an object, by applying, to each of the slices, a slice-selective magnetization preparation module and an imaging module, the slice-selective magnetization preparation module being executed with a first T2 preparation time having a first time echo;
performing a second image acquisition module of the pulse sequence, to acquire a second MR data from the slices disposed at the different locations of the ROI, with a T2 preparation time different than that of the first image acquisition module, by applying, to each of the slices, the slice-selective magnetization preparation module and the imaging module, the slice-selective magnetization preparation module being executed with a second T2 preparation time having a second time echo different from the first time echo; and
generating a T2 map based on the first MR data and the second MR data.

24. The method of claim 1, wherein the performing the first image acquisition module comprises sequentially applying the slice-selective magnetization preparation module to each of the slices with the first time echo being equal to 0 ms, and, after each application of the slice-selective magnetization preparation module, acquiring the first MR data from each of the slices, respectively, the first MR data being T2-weighted with the first time echo, and
the performing the second image acquisition module comprises sequentially applying the slice-selective magnetization preparation module to each of the slices with the second time echo being greater than 0 ms, and, after each application of the slice-selective magnetization preparation module, acquiring the second MR data from each of the slices, respectively, the second MR data being T2-weighted with the second time echo.

* * * * *